(12) United States Patent
Koga et al.

(10) Patent No.: US 8,007,909 B2
(45) Date of Patent: Aug. 30, 2011

(54) CARBON FILM

(75) Inventors: Yoshinori Koga, Ibaraki (JP); Masataka Hasegawa, Ibaraki (JP); Sumio Iijima, Ibaraki (JP); Kazuo Tsugawa, Ibaraki (JP); Masatou Ishihara, Ibaraki (JP)

(73) Assignee: National Institute of Advanced Industrial Science & Technology, Tokyo (JP)

( * ) Notice: Subject to any disclaimer, the term of this patent is extended or adjusted under 35 U.S.C. 154(b) by 583 days.

(21) Appl. No.: 11/578,660

(22) PCT Filed: Apr. 15, 2005

(86) PCT No.: PCT/JP2005/007342
§ 371 (c)(1),
(2), (4) Date: Oct. 18, 2006

(87) PCT Pub. No.: WO2005/103326
PCT Pub. Date: Nov. 3, 2005

(65) Prior Publication Data
US 2007/0172660 A1    Jul. 26, 2007

(30) Foreign Application Priority Data

Apr. 19, 2004 (JP) .................. 2004-123169

(51) Int. Cl.
*C01B 31/00* (2006.01)
(52) U.S. Cl. ................ 428/408; 423/446
(58) Field of Classification Search .......... 428/408, 428/446, 336, 217, 426, 698, 457; 427/577; 51/307, 309; 423/446; 257/77
See application file for complete search history.

(56) References Cited

U.S. PATENT DOCUMENTS

| | | | | | |
|---|---|---|---|---|---|
| 4,968,647 | A | * | 11/1990 | Ownby | 501/99 |
| 5,013,579 | A | * | 5/1991 | Yamazaki | 427/577 |
| 5,204,167 | A | * | 4/1993 | Saijo et al. | 428/408 |
| 5,221,293 | A | * | 6/1993 | Ferlemann et al. | 51/295 |
| 5,384,195 | A | * | 1/1995 | Bachmann et al. | 428/408 |
| 5,699,325 | A | * | 12/1997 | Bach | 368/286 |
| 5,705,272 | A | * | 1/1998 | Taniguchi | 428/408 |
| 5,720,808 | A | * | 2/1998 | Hirabayashi et al. | 423/446 |
| 5,785,754 | A | * | 7/1998 | Yamamoto et al. | 117/89 |
| 5,897,924 | A | * | 4/1999 | Ulczynski et al. | 427/577 |
| 5,989,511 | A | * | 11/1999 | Gruen et al. | 423/446 |

FOREIGN PATENT DOCUMENTS

CN    1066299    11/1992

(Continued)

OTHER PUBLICATIONS

J. Narayan, et al., Enhancement of nucleation and adhesion of diamond films on copper, stainless steel, and silicon substrates, Jan. 15, 1992, Journal of Applied Physics, 71, p. 966-971.*

(Continued)

*Primary Examiner* — Archene Turner
(74) *Attorney, Agent, or Firm* — Morgan, Lewis & Bockius LLP

(57) ABSTRACT

Disclosed is a carbon film which has optical characteristics of retaining a high transparency and being high in refractive index and low in double refractivity, is excellent in electric insulating performance, can be applied to various base materials with good adhesiveness, and can be formed at low temperature. Also disclosed is a laminate including a carbon film and a method for producing the laminate.

9 Claims, 16 Drawing Sheets

FOREIGN PATENT DOCUMENTS

| | | | |
|---|---|---|---|
| JP | 06-158323 | * | 6/1994 |
| JP | A-10-95694 | | 4/1998 |
| JP | 11-058106 | * | 3/1999 |
| JP | 2001-145828 | * | 5/2001 |
| JP | 2002-275633 A | | 9/2002 |

OTHER PUBLICATIONS

Milton Ohring, Materials Science of Thin Films, No Month 2002, Academic Press, 2nd Ed., pp. 323-330, 337-343, and 349.*

Chiem et al., Lonsdaleite diamond growth on reconstructed Si(100) by hot-filament chemcial vapor deposition, No month 2003, Korean J. Chem. Eng., 20(6), p. 1154-57.*

Subramanian, et al., The effect of growth rate control on the morphology of nanocrystalline diamond, Mar. 8, 2005, Diamond & Related Materials, 14, p. 404-410.*

Akimitsu Hatta, et al., "Low temperature fabrication of diamond films with nanocrystal seeding", Nihon Kessho Seichol Gakkaishi, 1995, vol. 22, No. 4, pp. 325-328. (Translation of Abstract included).

D. Zhou. et al., "Control of diamond film microstructure by Ar addtions to $CH_4/H_2$ microwave plasmas", J. Appl. Phys., 1998, vol. 84, No. 4, pp. 1981-1989, August.

Ulczynski, M. J. et al. "Diamond-coated glass substrates" Diamond and Related Materials, 1998, 7, pp. 1639-1646, December.

Sung-Pill Hun et al., "Synthesis and tribological characteristics of nanocrystalline diamond film using $CH_4/H_2$ microwave plasmas", Diamond and Related materials 11 (2002) 877-881.

* cited by examiner

UPPER SURFACE

LATERAL SURFACE

BOUNDARY SURFACE

UPPERMOST SURFACE

DIFFRACTION IMAGE

EELS SPECTRUM

WAVELENGTH DISPERSION OF PHASE DIFFERENCE

WAVELENGTH DISPERSION OF Δnd

PENETRATION CURVES WITH ROUGHNESS (nm)

CARBON FILM

TECHNICAL FIELD

The invention relates to a carbon film and a laminate having new physical properties, and an optical device, optical glass, wrist watch, electronic circuit substrate, or grinding tool comprising the same.

BACKGROUND ART

A thin carbonaceous film has various excellent characteristics such as high hardness, heat conductivity, electric insulating property, transparency, high refraction index, chemical resistance, low friction property, and low abrasion property. In recent years, coating for improving the performance of various substrates has been demanded in view of its excellent environmental compatibility and biocompatibility. Particularly, for a diamond-like carbon film or diamond film, as a thin carbonaceous film having excellent physical properties, improvement of the coating technique has been expected for enhancing mechanical, optical, and electrical functions of various substrates. However, the diamond-like carbon and diamond involve the following problems due to their characteristics at present and development of a new carbon film has been desired for solving such problems.

In the case of forming a carbon film on a substrate using glass as a substrate, it has been expected for prevention of injury at the surface due to high hardness thereof and application to optical devices having new functions due to high refraction index thereof. For example, a method of forming a microcrystal diamond (hereinafter simply referred to as MCD) film on a glass substrate by a CVD method has already been known (for example, refer to Patent Document 1 and Non-Patent Document 1).

For application as an optical protective film, it has been attempted to utilize the high transmittance of a diamond film. It has been known that the transmittance becomes higher as the grain size of the diamond particles coating the glass surface is smaller and the surface roughness is smaller. However, according to conventional CVD methods, since the MCD formed has a grain size as large as from 0.3 μm to several μm, the obtained MCD film lacks in the surface planarity and sufficient transmittance cannot be obtained. For improving the transmittance, it is necessary to form a planar surface by grinding, and the cost therefore is one of causes for inhibiting the popularization.

Accordingly, it has been attempted for developing a method of forming a planar surface without requiring grinding by making the grain size of the diamond particles smaller. However, the conventional methods involve a problem that amorphous carbon exhibiting black color intrudes simultaneously with deposition of diamond having small grain size, to result in a problem of deteriorating the transmittance though the surface becomes planar.

Further, in the case of utilizing a carbon film coating for a glass protective film, high adhesion is required. For example, Patent Document 1 discloses a method of coating diamond on a glass substrate having a good performance according to a tape test. However, in the application use, for example, in the coating of front glass of an automobile or coating on a spectacle lens, coating retaining higher adhesion as well as high transmittance are necessary.

Moreover, for optical application to the lens such as in spectacles, cameras and cinema projectors, it is important that the coating layer has high refraction index and shows no double refractivity. However, in the case of utilizing the CVD method as a general coating method, it is extremely difficult to synthesize diamond not showing double refractivity in view of thermal strains or residual stresses. Further, the density is often lowered, and the refractive index is usually lowered considerably. Accordingly, it has been a problem that the diamond coating is not suitable for the optical application.

Additionally, in view of high hardness, and low friction or low abrasion characteristic, coating of a thin carbon film to sliding portions of mechanical parts made of iron or stainless steel as the material has been expected. However, since the coating of the diamond-like carbon film or the diamond film to an iron substrate involves a problem that a film is not deposited due to the intrusion of carbon atoms as the constituent element of the film into the iron substrate or a problem of making the substrate brittle, practical use thereof is extremely difficult. On the other hand, an intermediate layer forming method of coating the surface of the iron substrate with a thin film of titanium, chromium or a nitride thereof prior to the coating has been developed. However, in view of the problem of requiring a cost for forming the intermediate layer or the problem that the adhesion of the coating is still low, it has been demanded for the development of a coating instead of diamond-like carbon or diamond.

In addition, in the case of using copper as a substrate, it is desired for coating the diamond-like carbon film or the diamond film to an electronic circuit substrate having a copper surface in view of the high electric insulating property thereof. However, deposition of the film to the surface of copper is extremely difficult. Further, even if it is deposited, adhesion of the film to the copper surface is low, which results in a significant problem that the film tends to be peeled soon. In order to improve this problem, formation of an intermediate layer of titanium or a nitride thereof has been attempted as in the iron substrate described above. However, this also results in a problem for the occurrence of cost and a problem of low adhesion. Further, in a case of conducting, particularly, diamond coating by the CVD method which is a usual method, boron in the atmosphere is easily taken into the film with no intentional doping, which results in a significant problem that the electric insulating property of the diamond coating is lowered.

Further, as a method of coating the carbon film to a plastic substrate, coating of a diamond-like carbon film to a PET bottle has been put to practical use. However, it has been demanded for the coating of plastics with diamond for the use at a higher temperature and in the optical utilization. For example, 90% or more of receptacle lenses have been made of plastics in recent years. In the case where the diamond coated plastic spectacle lens can be prepared, it is possible to prevent injuries to the lens or prepare a high functional lens by utilizing the high refraction index of diamond. However, synthesis for the diamond film requires a high temperature of 600° C. or higher at the lowest and, accordingly, diamond is not suitable at present as a coating material for plastics.

Patent Document 1: JP-A-10-95694
Non-Patent Document 1: Diamond and Related Materials vol. 7, pp 1639-1646 (1998)

DISCLOSURE OF THE INVENTION

Problem that the Invention is to Solve

The invention has been achieved in view of the foregoing situations in the current carbon films represented by diamond-like carbon or diamond. That is, an object of the invention is to provide a carbon film and a laminate having optical characteristics of retaining high transparency, having high refraction index and less double refractivity even in a case where the particle is smaller, excellent in electric insulating property, capable of being coated at good adhesion irrespective of the kinds of substrates including iron, copper and plastics, and capable of being formed at a low temperature, as well as to provide an optical device, optical glass, wrist watch, electronic substrate, or grinding tool utilizing the same.

Means for Solving the Problem

The present inventors have made earnest studies for the preparation of a carbon film and a laminate having the various characteristics as described above, and as a result, have found that a carbon film and a laminate having excellent performance can be formed by conducting a CVD treatment under specified conditions and have accomplished the invention based on the findings.

Namely, a carbon film of the invention has an approximate spectrum curve obtainable by superimposing, on a peak fitting curve A at a Bragg's angle ($2\theta\pm0.3°$) of 43.9°, a peak fitting curve B at 41.7° and a base line in an X-ray diffraction spectrum by $CuK\alpha_1$ ray and has a film thickness of from 2 nm to 100 µm.

The fitting curve A referred to in the present specification is a curve of a Pearson VII function, and the fitting curve B is a curve of an asymmetrical normal distribution function. Further, the base line is represented by a primary function.

With regard to the carbon film, the intensity of the fitting curve B relative to the intensity of the fitting curve A is preferably from 5 to 90% in the approximated spectrum described above.

With regard to the carbon film, the Raman shift has a peak at a $1333\pm10$ cm$^{-1}$ and the half-value width of that peak is preferably from 10 to 40 cm$^{-1}$ in the Raman scattering spectrum.

Another carbon film of the invention has an approximate spectrum curve obtainable by superimposing, on a peak fitting curve A at a Bragg's angle ($2\theta\pm0.3°$) of 43.9°, a peak fitting curve B at 41.7° and a base line in an X-ray diffraction spectrum by $CuK\alpha_1$ ray, wherein the fitting curve B has an intensity of from 5 to 90% relative to an intensity of the fitting curve A, wherein the carbon film has a film thickness of from 2 nm to 100 µm, and wherein the carbon film has a Raman shift having a peak at $1333\pm10$ cm$^{-1}$, said peak having a half-value width of from 10 to 40 cm$^{-1}$ in the Raman scattering spectrum.

The carbon film preferably has a planar surface with the surface roughness (Ra) of 20 nm or less.

The carbon film preferably has an electric resistivity of the carbon film of $1\times10^7$ Ωcm or higher at 100° C. and preferably has an average transmittance in a wavelength region of from 400 to 800 nm of 60% or more.

Further, the carbon film preferably has a refraction index at a wavelength of 589 nm of 1.7 or more, and preferably has a double refractivity at a wavelength of 589 nm of 1.0 nm or less. Further, the carbon film preferably has a hardness of 20 GPa or more.

A laminate of the invention comprises a substrate; and a carbon aggregate film having a thickness of 2 nm to 100 µm which is disposed on the substrate, wherein the carbon aggregate film comprises an aggregate of carbon particles having an approximate spectrum curve obtainable by superimposing, on a peak fitting curve A at a Bragg's angle ($2\theta\pm0.3°$) of 43.9°, peak fitting curve B at 41.7° and a base line in an X-ray diffraction spectrum by $CuK\alpha_1$ ray.

In the present specification, the fitting curve A is a curve of a Pearson VII function, the fitting curve B is a curve of an asymmetric normal distribution curve, and the base line is represented by a primary function.

With regard to the laminate, the carbon particles are preferably constituted continuously or discontinuously in the carbon aggregate film.

Further, the laminate has a surface density of the carbon particles preferably within a range of from $1\times10^{10}$ cm$^{-2}$ to $4\times10^{13}$ cm$^{-2}$.

Another laminate of the invention comprises a substrate; and a carbon aggregate film having a thickness of 2 nm to 100 µm which is disposed on the substrate, wherein the carbon aggregate film comprises an aggregate of carbon particles having an approximate spectrum curve obtainable by superimposing, on a peak fitting curve A at a Bragg's angle ($2\theta\pm0.3°$) of 43.9°, a peak fitting curve B at 41.7° and a base line in an X-ray diffraction spectrum by $CuK\alpha_1$ ray, wherein the fitting curve B has an intensity of from 5 to 90% relative to an intensity of the fitting curve A, wherein the carbon particles have a Raman shift having a peak at $1333\pm10$ cm$^{-1}$, said peak having a half-value width of from 10 to 40 cm$^{-1}$ in the Raman scattering spectrum, and wherein the carbon particles are aggregated on the substrate to give a surface density of from $1\times10$ cm$^{-2}$ to $4\times10^{13}$ cm$^{-2}$.

With regard to the laminate, the substrate is, preferably, one member selected from glass, quartz, silicon, plastic, ceramic, or a group of metals such as stainless steel and copper.

With regard to the laminate, the carbon aggregate film preferably has an electric resistivity of $1\times10^7$ Ωcm or higher at 100° C.

With regard to the laminate, the carbon aggregate film preferably has an average transmittance of 60% or more to a light having a wavelength region of 400 to 800 nm, the carbon aggregate film preferably has a refraction index to a light having a wavelength of 589 nm of 1.7 or higher, and the carbon aggregate film preferably has a double refractivity to a light having a wavelength of 589 nm of 1.0 nm or less.

With regard to the laminate, the carbon aggregate film preferably has a hardness of 20 GPa or more.

Further, with regard to the laminate, adhesion between the glass substrate and the carbon aggregate film is preferably 20 GPa or more.

Further, with regard to the laminate, the stainless steel substrate and the carbon aggregate film preferably have an adhesion strength of 0.3 MPa in a flatwise test, and the copper substrate and the copper aggregate film preferably have an adhesion strength of 0.3 MPa or more in a flatwise test.

Further, the invention relates to an optical device, optical glass, wrist watch, electronic circuit substrate, or grinding tool comprising the laminate described above.

Effect of the Invention

The carbon film, the carbon particle, and the laminate of the invention have optical characteristics of retaining a high transparency, have a high refraction index and a small double refractivity even when the particle is smaller, are excellent in the electric insulating property, can be coated with good adhesion irrespective of the types of the substrates including iron, copper, and plastics, and can be formed at a low temperature.

Since the carbon film of the invention has the characteristics described above, it can be used in the application such as a protective film for large area glass, optical material at high refraction index, highly heat conducting heat sink, electrode material, protection film for machine tool, grinding tool, electron emission material, high frequency device (SAW device), gas barrier coating material, triboelectric material, protective film for cover glass such as in wrist watch and mobile telephone, biocompatible material, and biosensor.

BEST MODE FOR CARRYING OUT THE INVENTION

The carbon film of the invention, as shown in FIG. 1, has an approximate spectral curve obtainable by superimposing, on a peak fitting curve A at a Bragg's angle ($2\theta\pm0.3°$) of 43.9°, a peak fitting curve B at 41.7° and a base line in an X-ray diffraction spectrum by $CuK\alpha_1$ ray, and has a film thickness of from 2 nm to 100 μm. According to the invention, the fitting curve A is a curve of a Pearson VII function, the fitting curve B is a curve of an asymmetric normal distribution function, and the base line is represented by a primary function.

It is desirable that the Raman shift has a peak at $1333\pm10$ $cm^{-1}$, and that the half-value width of the peak is from 10 to 40 $cm^{-1}$, according to the measurement for the Raman scattering spectral spectrum of the carbon film. Further, the film has a surface density of the carbon particles within a range, preferably, of from $1\times10^{10}$ $cm^{-2}$ to $4\times10^{13}$ $cm^{-2}$ and, more preferably, within a range of from $1\times10^{11}$ $cm^{-2}$ to $4\times10^{12}$ $cm^{-2}$. The surface roughness as Ra is from 2 to 20 nm according to the AFM measurement. Further, the film shows a transmittance of 90% or higher in average to a visible light (wavelength: 400 to 800 nm) with a film thickness of 500 nm. Furthermore, the film has an electric resistivity of $1\times10^7$ Ωcm or higher at 100° C.

The carbon film of the invention can be obtainable mainly by adopting specified production conditions. For preparing the carbon film, it is necessary for using a surface wave plasma generation apparatus capable of forming a large area film, selecting the concentration, the molar ratio of the starting gas, the reaction time, etc. as the operation conditions and conducting operation at a relatively low temperature.

The method of producing the carbon film according to the invention is to be described for the outline with reference to examples.

For example, fine diamond particles are deposited to a substrate made of, e.g., glass, silicon, iron, titanium, copper, or plastics by a supersonic treatment, which is applied with a surface wave plasma treatment by a low-temperature surface wave plasma CVD apparatus using a gas containing 98% hydrogen, 1% gaseous carbon dioxide, and 1% methane gas at a pressure of $1\times10^2$ Pa.

The treating time is from several hours to several tens hours and the treating temperature is from 50 to 600° C. By the treatment described above, fine carbon particles having a grain size of 2 to 30 nm are deposited to the surface of the substrate. By making the time longer for the surface wave plasma treatment, carbon particles are deposited extremely densely with no gaps and a film of 2 μm thickness or more can also be formed.

Further, fine carbon particles are deposited in a case of the copper substrate without deposition of fine diamond particles by a supersonic treatment. Further, when the deposition layer of fine carbon particles is measured by various film test methods, it has been found that the layer has outstanding properties such that those having a film thickness of 500 nm have a transmittance to visible light is 95% or higher, adhesion to the substrate is high, refraction index is high (2.1 or higher at wavelength of 589 nm), double refractivity is scarcely present, surface is planer so as to have a surface roughness (Ra) of 20 nm or less in the case of a film of 2 μm thickness, and further, the electric resistivity at a temperature 100° C. is extremely high so as to be $10^7$ Ωcm or higher. As described above, the carbon particles and the carbon film formed by the method have an outstanding performance having high transparency and capability of direct deposition coating also to the iron or copper substrate.

For producing the carbon film of the invention, it is preferable to prepare the carbon film on the substrate as described above and as typical example of the substrate, glass is used. The glass substrate includes various kinds of glass conventionally known, such as, soda lime glass or borosilicate glass. The thickness of the glass is not particularly restricted and it is selected properly in accordance with the application use of products. It is generally about from 100 to 0.5 mm.

According to the invention, at first, nano-crystal diamond particles, cluster diamond particles, or graphite cluster diamond particles are deposited, or adamantane ($C_{10}H_{16}$), derivatives thereof, or multimers thereof are deposited to a glass substrate.

Usual nano-crystal diamond particles are diamond prepared by explosion synthesis, or pulverization of diamond synthesized at high temperature and high pressure. Cluster diamond particles are aggregates of nano-crystal diamond particles, and graphite cluster diamond particles are cluster diamond particles containing a large amount of graphite or amorphous carbon ingredients.

For the nano-crystal diamond, a colloidal solution formed by dispersing nano-crystal diamond obtainable by explosion synthesis in a solvent has been marketed from the NanoCarbon Research Institute Ltd. or nano-crystal diamond powder prepared by pulverization, or dispersion thereof in a solvent has been already marketed, for example, from Tomei Diamond Co. Ltd. The nano-crystal diamond particles used in the invention have an average grain size of 4 to 100 nm, preferably, from 4 to 10 nm. The nano-crystal diamond is described specifically, for example, in the literature "Hiroshi Makita, New Diamond vol. 12, No. 3, pp 8-13 (1999)".

For depositing the nano-crystal diamond particles on the glass substrate, the particles are dispersed in water or ethanol. In this case, for improving the dispersibility, a surfactant (for example, sodium salt of lauryl sulfate ester, sodium oleate, etc.) is added, a substrate is dipped in the liquid dispersion and put to a supersonic cleaning apparatus and then the substrate is dipped in ethanol to conduct supersonic cleaning and then the substrate is taken out and dried.

As described above, a glass substrate with deposition of nano-crystal diamond particles on the surface can be obtained. Deposition of the nano-crystal diamond particles to the glass substrate is attained by burying of a portion of the particles to the surface of the substrate due to physical force in the supersonic cleaning treatment.

The deposition ratio of the nano-crystal diamond particles to the substrate surface is, preferably, from $10^9$ to $10^{12}$, more preferably, from $10^{10}$ to $10^{11}$ per 1 $cm^2$. The diamond particles deposited to the glass substrate act as seed crystals for the growth of the carbon film in the surface wave plasma treatment.

In this case, the deposition ratio of the nano-crystal diamond particles deposited on the substrate surface can be decreased by decreasing the concentration of the nano-crystal diamond particles to be dispersed in a dispersion medium (water, ethanol, etc.). This can lower the density for the occurrence of nuclei of the carbon particles in the surface wave plasma treatment to obtain not a continuous film but a discontinuous film comprising an accumulation body of carbon particles. The surface density of the carbon particles in the accumulation body can be controlled by the concentration of the nano-crystal diamond particles in the liquid dispersion. Further, the grain size of the carbon particles can be controlled by the time of conducting the surface wave plasma treatment. An accumulation body comprising carbon particles isolated on the substrate can be prepared by decreasing the concentration extremely. Further, by treating the accumulation body with hydrofluoric acid or the like to remove the substrate from the accumulation body, only the carbon particles can also be obtained.

Furthermore, an identical deposition effect with that by the supersonic cleaning method can be obtained by spin coating the liquid dispersion of the nano-crystal diamond on the substrate and then drying the same, which is another method of depositing the nano-crystal diamond particles in the substrate.

The cluster diamond particles are aggregates of the nano-crystal diamond prepared by the explosion synthesis method, which are excellent in the transparency and already sold, for example, from Tokyo Diamond Tools Mfg. Co., Ltd., etc. According to the cluster diamond particles used in the invention, the grain size distribution is, preferably, from 4 to 100 nm and, more preferably, from 4 to 10 nm. The cluster diamond particles are described in details in the document "Hiroshi Makita, New Diamond, vol. 12, No. 3, p 8 to 13 (1996)".

For depositing the cluster diamond particles on the glass substrate, the particles are dispersed in water or ethanol. In this case, for improving the dispersibility, a surfactant (for example, sodium salt of lauryl sulfate ester, sodium oleate, etc.) is added, a substrate is dipped in the liquid dispersion and put to a supersonic cleaning apparatus, then the substrate is dipped in ethanol to conduct supersonic cleaning, and then the substrate is taken out and dried.

As described above, a glass substrate with deposition of cluster diamond particles on the surface can be obtained. Deposition of the cluster diamond particles to the glass substrate is attained by the burying of a portion of the particles in the surface of the substrate due to the physical force in the supersonic cleaning treatment. The deposition ratio of the cluster diamond particles to the substrate surface is, preferably, from $10^9$ to $10^{12}$, more preferably, from $10^{10}$ to $10^{11}$ per 1 cm$^2$. The diamond particles deposited to the glass substrate act as seed crystals for the growth of the carbon film in the surface wave plasma treatment.

In this case, deposition ratio of the cluster diamond particles deposited to the substrate surface can be decreased by decreasing the concentration of the cluster diamond particles to be dispersed in a dispersion medium (water, ethanol, etc.). This can lower the density for the generation of nuclei of the carbon particles in the surface wave plasma treatment to obtain not a continuous film but a discontinuous film comprising an accumulation body of carbon particles. The surface density of the carbon particles in the accumulation body can be controlled by the concentration of the cluster diamond particles in the liquid dispersion. Further, the grain size of the carbon particles can be controlled by the time for conducting the surface wave plasma treatment. Further, an accumulation body comprising isolated carbon particles can be prepared on the substrate by decreasing the concentration extremely. Further, by treating the accumulation body with hydrofluoric acid or the like to remove the substrate from the accumulation body, only the carbon particles can also be obtained.

Further, an identical deposition effect with that by the supersonic cleaning method can be obtained by spin coating the liquid dispersion of the cluster diamond on the substrate and then drying the same, which is another method of depositing the cluster diamond particles on the substrate.

For depositing the graphite cluster diamond particles on the glass substrate, the particles are dispersed in water or ethanol. In this case, for improving the dispersibility, a surfactant (for example, sodium salt of lauryl sulfate ester, sodium oleate, etc.) is added, a substrate is dipped in the liquid dispersion and put to a supersonic cleaning apparatus, then the substrate is dipped in ethanol to conduct supersonic cleaning, and then the substrate is taken out and dried.

As described above, a glass substrate with deposition of graphite cluster diamond particles on the surface can be obtained. Deposition of the graphite cluster diamond particles to the glass substrate is attained by the burying of a portion of the particles in the surface of the substrate due to the physical force in the supersonic cleaning treatment.

The deposition ratio of the graphite cluster diamond particles to the substrate surface is, preferably, from $10^9$ to $10^{12}$ and, more preferably, from $10^{10}$ to $10^{11}$ per 1 cm$^2$. The diamond particles deposited to the glass substrate act as seed crystals for the growth of the carbon film in the surface wave plasma treatment.

In this case, the deposition ratio of the graphite cluster diamond particles deposited to the substrate surface can be decreased by decreasing the concentration of the graphite cluster diamond particles to be dispersed in a dispersion medium (water, ethanol, etc.). This can lower the density for the occurrence of nuclei of the carbon particles in the surface wave plasma treatment to obtain not a continuous film but a discontinuous film comprising an accumulation body of carbon particles. The surface density of the carbon particles in the accumulation body can be controlled by the concentration of the graphite cluster diamond particles in the liquid dispersion. Further, the grain size of the carbon particles can be controlled by the time for conducting the surface wave plasma treatment. Further, an accumulation body comprising isolated carbon particles can be prepared on the substrate by decreasing the concentration extremely. Further, by treating the accumulation body with hydrofluoric acid or the like to remove the substrate from the accumulation body, only the carbon particles can also be obtained. Further, in a case of preparing a continuous film on the substrate, a self-sustaining film can be prepared by the removal of the substrate.

Furthermore, an identical deposition effect with that by the supersonic cleaning method can be obtained by spin coating the liquid dispersion of the graphite cluster diamond on the substrate and then drying the same, which is another method of depositing the graphite cluster diamond particles on the substrate.

Adamantane is a molecule represented by the molecular formula: $C_{10}H_{16}$, which is a sublimating molecular crystal having the same steric structure as the basic skeleton of diamond (at normal temperature, normal pressure), and is produced by the purification process of petroleum. Powders thereof, derivatives thereof, and multimers thereof have already been sold by Idemitsu Kosan Co., LTD.

In order to deposit adamantane, derivatives thereof, or multimers thereof on a glass substrate, the substance is dissolved in a solvent (for example, ethanol, hexane, acetone nitrile, etc.), then the substrate is dipped in the solution and subjected to supersonic cleaning and, subsequently, the substrate is taken out and dried. As described above, a glass substrate deposited at the surface thereof with adamantane, derivatives thereof, or multimers thereof can be obtained.

In this case, the deposition ratio of adamantane, derivatives thereof, or multimers thereof deposited on the substrate surface can be decreased by decreasing the concentration of adamantane, derivatives thereof, or multimers thereof to be dispersed in a solvent. This can lower the density for the occurrence of nuclei of the carbon particles in the surface wave plasma treatment to obtain not a continuous film but a discontinuous film comprising an accumulation body of carbon particles. The surface density of the carbon particles in the accumulation body can be controlled by the concentration of adamantane, derivatives thereof, or multimers thereof in the liquid dispersion. Further, the grain size of the carbon particles can be controlled by the time for conducting the surface wave plasma treatment. Further, an accumulation body comprising isolated carbon particles can be prepared on the substrate by decreasing the concentration extremely. Further, only the carbon particles can also be obtained by treating the accumulation body with hydrofluoric acid or the like to remove the substrate from the accumulation body.

Furthermore, an identical deposition effect with that by the supersonic cleaning method can be obtained by spin coating the solution of the substance on the substrate and then drying the same, which is another method of depositing adamantane, derivatives thereof, or multimers thereof on the substrate.

Then, according to the invention, a treatment is applied to a glass substrate deposited at the surface thereof with diamond particles, or adamantane, multimers thereof, or derivatives thereof obtained as described above (hereinafter simply referred to also as a glass substrate), by using a microwave plasma CVD apparatus.

The microwave plasma CVD apparatus (hereinafter also referred to simply as CVD apparatus) has already been known and is available, for example, from Applied Films Corporation. FIG. 3 shows the outline of the CVD apparatus. FIG. 4 shows the constitution of a reaction vessel thereof.

For applying the CVD treatment to the glass substrate, it is necessary to conduct the treatment at a temperature lower than the distortion point of the glass substrate. Since the pressure is from $2\times10^3$ to $1\times10^4$ Pa in the usual CVD treatment for diamond, the substrate temperature exceeds 800° C. and the treatment cannot be applied to the glass substrate. In order to lower the temperature, plasma treatment at a low pressure is necessary. For this purpose, in the invention, a surface wave plasma is generated under a pressure of about $1\times10^2$ Pa, which was utilized for the CVD treatment. The surface wave plasma is described specifically, for example, in the literature "Hideo Sugai, Plasma Electronics, Ohmusha Ltd., 2000, p. 124 to 125". This can lower the CVD treatment temperature for the glass substrate to a temperature lower than the distortion point and plasmas can be generated uniformly over a large area of 380 mm×340 mm or more. As a result of diagnosing the plasmas by a Langmure probe method (single probe method), it is confirmed that the plasma density is $8\times10^{11}/cm^3$ and this exceeds a critical plasma density of $7.4\times10^{10}/cm^3$ as the condition for the surface wave plasma with a microwave at a frequency of 2.45 GHz. The Langmure probe method is described specifically, for example, in the literature "Hideo Sugai, Plasma Electronics, Ohmusha Ltd., 2000, p. 58".

As the conditions for the CVD treatment used in the invention, a temperature, preferably, from 50 to 600° C., more preferably, from 300 to 450° C. and a pressure, preferably, from $5\times10^1$ to $5\times10^2$ Pa and, more preferably, from $1.0\times10^2$ to $1.2\times10^2$ Pa are used. The treating time is 0.5 to 20 hours and, usually, about 1 to 8 hours. By the treatment time, a film thickness of about 100 nm to 2 μm is obtained.

The starting gas (reaction gas) used for the CVD treatment is a gas mixture comprising a carbon-containing gas and hydrogen. The carbon-containing gas includes, for example, methane, ethanol, acetone, and methanol.

The concentration of the carbon-containing gas in the carbon-containing gas/hydrogen gas mixture is from 0.5 to 10 mol %, and preferably, from 1 to 4 mol %. In the case where the amount of the carbon-containing gas is more than the range described above, it is not preferred since this causes a problem such as lowering of transmittance.

Further, $CO_2$ or CO is preferably added to the gas mixture as an additive gas. The gas acts as an oxygen source and shows an effect of removing impurities in the CVD treatment.

The addition amount of $CO_2$ and/or CO is preferably from 0.5 to 10 mol %, and more preferably, from 1 to 4 mol % in the entire gas mixture.

In the case of applying the CVD treatment to the glass substrate according to the invention, in view of the adhesion between the glass substrate and the synthesized carbon film, the CVD treatment temperature (substrate temperature) is controlled desirably to a temperature lower than the distortion point of glass, preferably, to a low temperature of about 300 to 450° C. For example, in the case of a soda lime glass substrate, since the distortion point thereof is about at 470° C., the CVD treatment temperature therefore is a temperature lower than that, preferably, at 300 to 450° C. For a borosilicate glass such as Pyrex (registered trademark), the CVD treatment temperature is preferably from 400 to 550° C., and more preferably, from 450 to 500° C.

According to the invention, carbon particles or a carbon film can be formed on the glass substrate. The carbon particles and the carbon film have a remarkable feature different from other carbon particles and carbon films of diamond, etc., in that they have an approximate spectrum curve obtainable by superimposing, on a peak fitting curve A at a Bragg angle (2θ±0.3°) of 43.9°, a peak fitting curve B at 41.7±0.30 and a base line in an X-ray diffraction spectrum by $CuKa_1$ ray, as shown in FIG. 1.

Further, in the Raman scattering spectral spectrum, (excitation light wavelength: 244 nm) a distinct peak is observed near the Raman system 1333 $cm^{-1}$ and the full width half-value maximum (FWHM) is from 10 to 40 $cm^{-1}$. Further, in the case of the film, it is excellent in the planarity and the adhesion, and the surface roughness Ra is 20 nm or less and it is planar as reaching 3 nm or less depending on the case. Further, it has optically excellent properties being excellent in the transparency, having a refraction index as high as 2.1 or more and scarcely showing double refractivity, and also has excellent electric properties such as showing a high electric insulating property with the resistivity being as high as $10^7$ Ωcm or higher at a temperature of 100° C.

Further, from the observation for the film cross section by a high resolution power transmission type electronic microscopy, it is found to be characteristic that crystalline carbon particles with the grain size of 1 nm to several tens nm are formed with being packed without gaps and the grain size distribution does not change at the interface between the film and the substrate, in the film, and near the uppermost surface of the film (average grain size is substantially equal). The thickness of the carbon film thus obtainable is preferably from 2 nm to 100 μm, and more preferably, from 50 to 500 nm, and the grain size of the particle is preferably from 1 to 100 nm, and more preferably, from 2 to 20 nm.

Example

The present invention is to be described more specifically. However, the invention is no way restricted by such examples.

As a substrate, glass (borosilicate glass and soda lime glass) cut out to 300 mm×300 mm was used. Further, for manufacturing a specimen for evaluation, a wafer-like glass substrate of 4 inch diameter was also used. For increasing the density of nuclear formation of the carbon particles and forming a uniform film, a pre-treatment (deposition treatment of nano-crystal diamond particles) was conducted to the substrate before film formation.

A colloidal solution in which nano-crystal diamond particles of an average grain size of 5 nm were dispersed in pure water (manufactured by limited company, Nanocarbon Research Institute Ltd., products name: Nanoamand), a solution in which nano-crystal diamond particles of an average grain size of 30 nm or 40 nm were dispersed in pure water (manufactured by Tomei Diamond Co. Ltd., products name, MD30 and MD40 respectively), ethanol in which cluster diamond particles or graphite cluster diamond particles (manufactured by Tokyo Diamond Tools Mfg. Co., products name, CD, GCD respectively) dispersed in ethanol, or a solution of adamantane, derivatives thereof, or derivatives thereof (each manufactured by Idemitsu Kosan Co., Ltd.) was used, to which a substrate was dipped and put to a supersonic cleaning apparatus.

Then, the substrate was dipped in ethanol and applied with supersonic cleaning and dried, or the solution is coated uniformly on a substrate by spin coating and dried. The uniformness by the pre-treatment gives an effect on the uniformness of the carbon film after film formation. In this case, the number of diamond particles deposited on the substrate was from $10^{10}$ to $10^{11}$ per 1 $cm^2$.

As the starting gas, $CH_4$, $CO_2$, and $H_2$ were used and the concentration of $CH_4$ and $CO_2$ were defined each as 1 mol %. The gas pressure in the reactor was controlled to 1.0 to 1.2× $10^2$ Pa (1.0 to 1.2 mbar) lower than a pressure used for the usual CVD synthesis of diamond ($10^3$ to $10^4$ Pa), and microwave of 20 to 24 kW in total was charged to generate plasmas for a large area and uniformly over a region larger than the substrate area (300×300 $mm^2$). In this case, an Mo specimen table and a cooling stage were in close contact with each other and the distance between the substrate and the antenna was adjusted making it possible to keep the substrate temperature to 450° C. or lower during film formation which is the softening point of soda lime glass.

Film formation was conducted for 6 to 20 hours under the film forming conditions described above. A uniform and transparent carbon film was formed on the glass substrate after film formation. The thickness of the film was from 300 nm to 2 μm.

FIG. 5 shows a schematic photograph for a carbon film formed on a glass substrate of 300 mm×300 mm according to the invention. In FIG. 5, the substrate appears as if it were distorted because of the function of a camera but the substrate is not actually distorted. The film has a thickness of about 400 nm and is extremely transparent but presence of the film can be confirmed by interference color.

The carbon film was observed by X-ray diffraction. Details for the measurement are to be described. The X-ray diffraction apparatus used is an X-ray diffraction measuring apparatus RINT2100 XRD-DSCII manufactured by Rigaku Corporation and a goniometer is ultima III horizontal goniometer manufactured by Rigaku Corporation. A multi-purpose specimen table for thin film standard was attached to the goniometer. The measured specimen is a carbon film of 500 nm thickness prepared on a borosilicate glass substrate of 1 mm thickness by the method as described above. Those cut out to 30 mm square together with the glass substrate were measured. As X-rays, copper (Cu) $Ka_1$ rays were used. The voltage and current applied to the X-ray tube were 40 kV and 40 mA. A scintillation counter was used for an X-ray detector. At first, the scattering angle (2θ angle) was calibrated by using a silicon standard specimen. Deviation of 2θ angle was +0.02° or less. Then, the measuring specimen was set to the specimen table and the 2θ angle was adjusted to 0°, i.e., the X-ray incident direction and the specimen surface were in parallel and one-half of the incident X-rays is shielded by the specimen. The goniometer was rotated from the state and X-rays were irradiated at an angle of 0.5° relative to the specimen surface. The 2θ angle was rotated at 0.02° step from 10° to 90° while fixing the incident angle, and the intensity of X-rays scattering from the specimen at 2θ angle for each of them was measured. A computer program used for the measurement is RINT2000/PC software Windows (registered trademark) version.

FIG. 1 shows a measured spectrum of X-ray diffraction. Blanc circles in the graph are measuring point. It can be seen that a distinct peak is present at 2θ of 43.9°. It is interesting, as can be seen from FIG. 1, that the peak at 43.9° has a shoulder at 2θ of 41 to 42° on the lower angle side thereof (for "shoulder" of the spectrum, refer to "Kagaku Daijiten (Chemical Encyclopedia)" (Tokyo Kagaku Dojin). Accordingly, the peak comprises a two-component peak having a peak (first peak) about at 43.9° as a center and another peak (second peak) distributed about at 41 to 42°. In X-ray diffraction by $CuKa_1$ rays, diamond has been known as a carbonaceous substance having a peak at 2θ of 43.9°. FIG. 2 is a spectrum measured for diamond by X-ray diffraction and the peak is attributable to (111) reflection of diamond. Difference of the X-diffraction spectrum between the carbon film of the invention and diamond is clear, and the second peak distributed about at 41 to 42° appearing in the spectrum of the carbon film of the invention cannot be seen in diamond. As described above, (111) reflection of diamond consists of the first component (only the first peak) at 43.9° as the center in which shoulder on the lower angle side as in the carbon film of the invention is not observed. Accordingly, the second peak distributed about at 41 to 42° observed in the spectrum of the carbon film of the invention is a peak inherent to the carbon film of the invention.

Further, it can be seen that the peak for the X-ray diffraction spectrum of the carbon film of the invention in FIG. 1 is much broaden when compared with the peak of diamond in FIG. 2. Generally, as the size of particles constituting the film decreases, the width of the X-ray diffraction peak is widened more and the size of the particles constituting the carbon film of the invention can be said to be extremely small. When the size of the carbon particle constituting the carbon film of the invention (average diameter) is estimated based on the width of the peak according to the Sherrer's formula usually used in the X-ray diffraction, it was about 15 nm. For the Sherrer's formula, refer, for example, to "Hakumaku (Thin Film) Handbook, edited by Japan Society for the Promotion of Science, Thin Film, 131st Committee, from Ohmusha Ltd., in 1983, p. 375".

Then, details for the constitution of the peak (positions and strength for respective peak ingredients) are to be considered.

For determining the detailed constitution of the peak at 2θ of 43.9° in the X-ray diffraction measurement for the carbon film of the invention, analysis was conducted for 2θ angle from 39° and 48° by using peak fitting. For the fitting of the first peak, a function called as a Pearson VII function was used. The function is used most generally as representing the profile of peak in the diffraction method such as X-ray diffraction or neutron diffraction. The Pearson VII function can be referred to "Introduction Practice of Powder X-ray Analysis—Introduction to Rietveld Method" (edited by X-ray Analysis Study Conference of Japan Society for Analytical Chemistry, Asakura Shoten). Further, as a result of study for various functions, it has been found that an asymmetric function is preferably used for the fitting of the second peak. In this example, an asymmetric normal distribution function (Gaussian distribution function) was used. The function is a normal distribution function having separate dispersion (standard deviation) values on the right and the left of the peak position, which is one of most simplest functions as a function used for the fitting of an asymmetric peak, and could fit to peak extremely favorably. Further, a linear function (primary function) was used as a base line (background) function.

While various computer programs can be utilized for actual fitting operation, ORIGIN version 6, peak fitting module Japanese edition (hereinafter as ORIGIN-PFM) was used. In ORIGIN-PFM, the Pearson VII function is represented as "Pearson 7", the asymmetric normal distribution function is represented as "BiGauss", and the linear function is represented as "line". The completion condition for fitting is defined such that the correlation coefficient representing the reliability of the fitting ("COR", or "Corr Coef" in ORIGIN-PFM) was 0.99 or more.

According to the analysis using the peak fitting, as shown in FIG. 1, it can be seen that the measured spectrum can be approximated well as the sum for the first peak according to the Pearson VII function (fitting curve A in the graph), a second peak according to the asymmetric normal distribution function (fitting curve B in the graph) and the base line according to the primary function (background) (total fitting curve in the graph). In the measurement, the center for the fitting curve A is at 2θ of 43.9°, while the fitting curve B has a maximum at 41.7°. Areas surrounded by respective fitting curves and the base line are respective peak intensities. Thus, the intensity of the second peak to the intensity of the first peak was analyzed. In the case of this specimen, the intensity of the second peak (fitting curve B) was 45.8% for the intensity of the first peak (fitting curve A).

When X-ray diffraction measurement was conducted for many specimens of the carbon film of the invention, a broad peak as shown in FIG. 1 was observed around 2θ of 43.9° as the center for all of the specimens. In addition, they were in a shape having a shoulder on the lower angle side as shown in FIG. 1, and comprised of the first peak and the second peak. When analysis was conducted by the same peak fitting for the X-ray diffraction spectrum measured for many specimens, it was found that fitting could be conducted well by using the functions described above. The center for the first peak was at 2θ of 43.9±0.3°. Further, it was found that the second peak had a maximum at 2θ of 41.7±0.3°. The intensity ratio to the first peak was 5% at the minimum and 90% at the maximum. The intensity ratio had large dependence on the synthesis temperature and it tended to increase as the temperature was lower. On the other hand, the peak position was substantially constant irrespective of the synthesis temperature.

What is to be noted for the analysis method of the X-ray diffraction measurement is that measured data scatter greatly as the intensity of the X-ray is smaller and no reliable fitting is possible. Accordingly, it is necessary to conduct the analysis by the fitting for those having the maximum intensity of the peak of 5000 counts or more.

As described above, it was found that the carbon film of the invention has a broad peak around 2θ of 43.9° as the center in the measurement of X-ray diffraction by CuKa$_1$ rays, and that the peak had a structure with a shoulder on the lower angle side. It was found by the analysis using the peak fitting that the peak could be approximated well by superimposing the first peak using the Pearson VII function having a center at 2θ of 43.9°, the second peak using the asymmetric normal distribution function being maximum at 41.7°, and the base line with the primary function (background).

Analysis by fitting was conducted in the same manner for the spectrum of diamond shown in FIG. 2. It was found that the peak could be approximated well only with the Pearson VII function having a center at 2θ of 43.9° in a case of diamond, quite different from the carbon film of the invention described above. Accordingly, it was found that the carbon film of the invention was a substance having a structure different from that of diamond.

The carbon film of the invention has a feature in that the second peak described above is observed and this is a carbon film having a structure different from that of diamond. The production step of the carbon film of the invention and the result of other measurements were studied and the structure was investigated. The synthesis method of the carbon film used in the invention has the following remarkable feature when compared with the CVD synthesis method for diamond. At first, while usual synthesis for the diamond has been conducted at a temperature of at least 700° C. or higher, the carbon film of the invention is synthesized at an extremely low temperature. Further, in a case of decreasing the grain size of the diamond film, a method of rapidly growing at a high concentration of about 10% for the concentration of the carbon source (molar ratio of methane gas) contained in the starting gas has been employed so far, the concentration of the carbon source is rather low as about 1%. That is, in this method, carbon particles are deposited at a low temperature extremely slowly for a long time to form a film. Accordingly, the carbon particles are deposited at a breaking situation where they are transformed to diamond or not. Accordingly, a force of promoting deposition of hexagonal system diamond which is carbon crystals more stable than the usual cubic system diamond or deposition of further stable graphite, and this is extremely instable as the state of crystal deposition. Further, once deposited graphite and amorphous carbonaceous substance are also removed by etching by a great amount of hydrogen plasmas contained in the starting gas. By means of such a deposition mechanism, they form a structure in which cubic system diamond and hexagonal system diamond are mixed, and portions removed by etching remain as defects at an extremely high concentration. Such defects are point defects as atomic vacancy, linear defects as relocation, or defects on the basis of the surface unit such as lamination defects are also contained in a great amount. Accordingly, it forms a structure in which X-ray diffraction peak at 43.9° has a shoulder on the lower angle side.

However, the feature of the X-ray diffraction peak described above is in association with high function of the carbon film of the invention. That is, while a structure containing defects at high concentration is formed since etching for graphite or graphite like substance is promoted due to the low speed synthesis at a low concentration of the carbon source, the transparency of the carbon film is kept high. Further, while the cubic system diamond and the hexagonal system diamond are mixed and defects at a high concentration are contained due to synthesis at high temperature, carbon is deposited with no penetration also to the iron substrate and can also be coated directly on copper. Further, the size of fine particles is aligned due to synthesis at low temperature and thermal strain is extremely small. That is, the structure in which the cubic system diamond and the hexagonal system diamond are mixed and defects at an extremely high concentration are contained results in a feature that the thermal strain is moderated and the optical double refractivity is small. Further, an extremely high electric insulating property is developed by virtue of the structure in the same manner.

Measurement of Raman scattering spectral spectrum was conducted for the carbon film. An ultraviolet excitation spectrometer, NRS-1000V manufactured by Jasco International Co., Ltd. was used for the measurement and a UV-laser at a wavelength of 244 nm was used for the excitation light (Ar ion laser 90C FreD manufactured by Coherent Inc.) was used. The power of the laser source was 100 mW and a beam attenuator was not used. An aperture was set to 200 μm. Measurement for twice with exposure time of 30 sec and 60 sec was accumulated to obtain a spectrum. The apparatus was calibrated with single crystal diamond synthesized at high temperature and high pressure as a standard specimen for Raman scattering spectroscopy (DIAMOND WINDOW Type: DW006 for Raman, Material: SUMICRYSTAL, manufactured by Sumitomo Electric Industries Ltd). The peak position of the Raman spectrum in the standard specimen was adjusted to Raman shift of 1333 cm$^{-1}$. A computer software, Spectra Manager for Windows (registered trademark) 95/98 ver. 1.00 manufactured by Jasco International Co., Ltd. for the standard of this apparatus was used for the measurement and the analysis.

FIG. 6 shows a typical measured Raman scattering spectral spectrum. The measured specimen is a carbon film of about 1 μm thickness prepared on a borosilicate glass wafer of 10 cm diameter and 1 mm thickness by the method described above. As seen in FIG. 6, a peak situated near the Raman shift of 1333 cm$^{-1}$ was distinctly observed in the Raman scattering spectrum of the carbon film. As a result of conducting measurement in the same manner also for many other specimens, it was found that the peak was within a range from 1320 to 1340 cm$^{-1}$ and always in a range of 1333±10 cm$^{-1}$. Further, a broad peak appearing near the Raman shift of 1580 cm$^{-1}$ showed the presence of the sp$^2$ bond component of carbon. As the ratio of the component increases, the film becomes not transparent black. In the case of FIG. 6, the height of peak was as low as about ½ compared with the height of peak at 1333 cm$^{-1}$ and as shown below, it was found that the film was a transparent film. The Full Width at Half-Maximum (FWHM) in this case was about 22 cm$^{-1}$. As a result of the same measurement also for many other specimens, it was found that FWHM was within a range from 10 to 40 cm$^{-1}$.

The cross section of the carbon film was observed by a high resolution transmission type electron microscope (HRTEM). The HRTEM apparatus used was H-9000 transmission electron microscope manufactured by Hitachi Ltd. and observation was conducted at an acceleration voltage of 300 kV. Further, a standard fitted specimen holder of the HR-TEM apparatus was used for the specimen holder. The specimen for observation was manufactured by any one of methods (1) slicing by an Ar ion milling treatment, (2) slicing by converging ion beam (FIB) fabrication, or (3) peeling the film surface with a diamond pen and collecting the obtained slice to a microgrid.

FIG. 7 shows an example of the result of observation. FIG. 7 is an example of observation for the film cross section on a glass substrate. In this case, the specimen was manufactured by the ion milling treatment. FIG. (a) is an interface between the film and the substrate, FIG. (b) is the outermost surface of the film, FIG. (c) is electron diffraction images of the film, and FIG. (d) shows the result of measurement for electron energy loss spectral (EELS) spectrum at the absorption edge of carbon K shell of carbon particles constituting the film. It can be seen from FIGS. (a) and (b) that lattice images are observed substantially over the entire surface of the film and the film is thoroughly buried with crystalline particles with no gaps. Further, electron beam diffraction images in the FIG. (c) are close to a ring pattern of polycrystal diamond at random alignment. However, diffraction spots not riding on one ring are contained in a great amount in a ring particularly corresponding to the diamond (111) face and they correspond to diffraction by a plane larger by 2 to 6% than the diamond (111) face in view of inter-planar spacing. The diamond film is remarkably different from usual diamond in this regard. Further, crystal grains with the grain size from 1 nm to several tens nm are packed without gaps and the grain size distribution does not change for the interface between the film and the substrate, in the film, and in the vicinity for the uppermost surface of the film. Further, it was observed that one particle comprises one or more crystallites. Further, it can be seen from EELS spectrum in FIG. d, that there are scarce peaks corresponding to σ-σ* transition showing the presence of C-C sp$^2$ bond but a peak corresponding to s-s* showing the presence of the sp$^3$ bond component is predominant. That is, it can be seen that the film comprises crystalline carbon particles comprising sp$^3$ bonded carbon atoms.

The crystallite is a microcrystal that can be regarded as a single crystal and generally one grain comprises one or plurality of crystallites. From the result of HRTEM observation, the size (average grain size) of the carbon particles (crystallites) in the film is not different for the interface with the substrate, in the film, and at the uppermost surface, which was within a range from 2 to 40 nm.

In a case where it could be regarded that the film was constituted with particles packed with no gaps, the average grain size was determined in accordance with the following procedures.

That is, the average grain size was decided in a transmission type electron microscopic photograph for the cross section of a carbon film by taking the average of the grain size for different particles (crystallites) by the number of at least 100 or more. In FIG. 7(a), a portion surrounded with a white closed curve is one particles and the area surrounded with the closed curve is determined and, assuming the value as S, the grain size D was decided as:

$$D=2\sqrt{S/\pi}$$

in which π represents the circle ratio.

Further, the surface density $d_s$ of the particle is determined based on the average grain size of the particles according to:

$$d_s=\text{unit area}/(\pi\times(\text{average grain size}/2)^2)$$

When the surface density of the carbon film of the invention is determined as described above, it has been found that this is not different for the interface, in the film, and at the uppermost surface and, it is within a range from $8\times10^{10}$ cm$^{-2}$ to $4\times10^{12}$ cm$^{-2}$.

The carbon film was observed under a scanning type electron microscope (SEM). After forming a carbon film of about 500 nm thickness on a borosilicate glass substrate of 10 cm diameter and 1 mm thickness as a specimen, the substrate was cracked and the substrate was inclined and the cross section thereof was observed. For preventing charge-up caused by the glass substrate and the diamond film each being a dielectric material, a relatively low acceleration voltage of 1 kV was used and it was observed at a relatively low magnification factor of about 7000×. FIG. 8 shows the result of observation. As seen in FIG. 8, the film was extremely planar and no distinct unevenness was observed at all at the magnification factor.

The surface of the carbon film was observed by an atomic force microscope (AFM) to evaluate the surface roughness. In this case, for suppressing the effect of the surface roughness of the substrate on the surface roughness of the film as less as possible, the film was formed on a mirror-polished quartz disk (10 mm diameter×3 mm thickness) with less surface roughness (arithmetic average height Ra=0.9 to 1.2 nm) and used as a specimen for measurement. The AFM apparatus used was a nano scope scanning type probe microscope manufactured by Digital Instruments Corporation and a canti-lever Nanoprobe Type NP-1 for use in scanning type probe microscope manufactured by Digital Instruments Corporation, was used as the canti-lever. A tapping mode was used for measurement and observation was conducted at a scanning size of 1 μm and at a scanning rate of 1.0 Hz.

FIG. 9 shows the result of observation for the film surface by an atomic force microscope (AFM). For the image processing for the result of observation and the evaluation for the surface roughness, the measurement and analysis computer software, Nanoscope III ver. 4.43r8 as the standard for AFM apparatus was used. By the analysis for the result of the observation, the surface roughness Ra of the film was 3.1 nm. Evaluation was also conducted for many other specimens and it was confirmed that the surface roughness was within a range of 2.6 to 15 nm as Ra while different depending on the deposition condition of the film. Also for the evaluation of the surface roughness of the quartz disk substrate before deposition of the film, measurement was conducted in the same manner and it was found that it was within a range from 0.9 to 1.2 nm as Ra.

The arithmetic average height Ra is described specifically, for example, in "JIS B 0601-2001" or "ISO 4287-1997".

Transmittance of the carbon film to a visible light was measured. As a specimen, a carbon film according to the invention formed on a borosilicate glass wafer substrate of 10 cm diameter and 1 mm thickness was used. As a transmittance measuring apparatus, UV/Vis/NIR Spectrometer Lambda 900 manufactured by Perkin Elmer Inc. was used and transmittance was measured in a wavelength region of from 300 nm to 800 nm. In the measurement, a light from a light source was divided into two optical channels, and one was applied to the specimen formed with the film and the other was applied to a glass substrate not formed with the carbon film. Thus, the transmittance spectrum of the specimen and that of the glass substrate were measured simultaneously, and the transmittance spectrum of the carbon fiber per se was determined by subtracting the spectrum of the glass substrate from the spectrum of the specimen. For measurement and analysis, UV-Winlab ver. X1.7A manufactured by Perkin Elmer Inc. as a computer software for measurement and analysis for the apparatus was used.

FIG. 10 shows an example of the measured transmission spectrum of the film. The thickness of the film was about 500 nm. When the average transmittance at a wavelength of from 400 nm to 800 nm in a visible light region was determined from the spectrum, the transmittance was about 90% and it was found that the transparency was extremely high as a not polished carbon film. Particularly, it has been found that the film had an outstandingly high transmittance even compared with a general not polished thin diamond film.

The refractive index of the carbon film was measured by phase difference measurement. A specimen prepared by forming the carbon film according to the invention on a borosilicate glass wafer substrate of 10 cm diameter and 1 mm thickness and cutting out the substrate into 20 mm square was used. A phase difference measuring apparatus NPDM-1000 manufactured by Nicon Corporation was used as a measuring apparatus and M-70 was used as a spectralizer. A xenon lamp was used as a light source, and Si—Ge was used as a detector. Further, Gramthomson was used as a polarizer and an analyzer, with the number of rotation of the polarizer being set to 1. Measurement was conducted at an incident angle of 65° and 60°, at a measuring wavelength of 350 to 750 nm and, at a 5 nm pitch. The measured phase difference D and the spectrum of the amplitude reflectance y were compared with calculation models to fit such that they approached the measured values (D, y), and the refraction index, the extinction coefficient, and the film thickness were decided based on the result of the best fitting between the measured values and the theoretical values. Calculation was conducted assuming that each layer of the specimen was an isotropic medium.

FIG. 11 shows the wavelength dependence of the refraction index and the extinction coefficient in the measurement for the phase difference. The result of evaluation for the film thickness was about 440 nm. It was found from FIG. 11 that the film had a high refraction index of 2.1 or more in the entire wavelength region of measurement. Further, the refraction index at the wavelength of 589 nm [Sodium D ray] was about 2.105.

The double refractivity of the carbon film was measured. A specimen prepared by forming the carbon film according to the invention on a borosilicate glass wafer substrate of 10 cm diameter and 1 mm thickness and cutting out the substrate into 20 mm square was used. Measurement was conducted by a phase difference measuring method, and a phase difference measuring apparatus NPDM-1000 manufactured by Nicon Corporation was used as a measuring apparatus, M-70 was used as the spectralizer and a halogen lamp was used as a light source. Further, Si—Ge was used as the detector, and Gramthomson was used as a polarizer and an analyzer. Measurement was conducted at a number of rotation of 1 for the polarizer at an incident angle each of 0°, for wavelength region of 400 to 800 nm at a 5 nm pitch. Further, the dependence on the angle of rotation was measured at a wavelength of 590 nm.

Measurement was conducted in an arrangement shown in FIG. 12. In FIG. 12, a specimen was rotated, a phase difference D=DS−DP (difference for S polarized light and p polarized light) was monitored at the angle of rotation, and wavelength dispersion measurement was entered with an angle showing the maximum phase difference as the direction of the maximum phase difference. The measuring light was incident on the side of a diamond film. Further, the measuring wavelength for the dependence of angle of rotation was 590 nm. Measurement was conducted in the same manner also for the borosilicate glass used for the substrate, which was compared with the glass substrate formed with the carbon film, by which double refractivity of the carbon film was evaluated.

FIG. 13 shows typical examples of the result of the measurement. In this case, the thickness of the carbon film was about 200 nm. At first as a result of measuring the dependence of the phase difference on the angle of rotation, it showed substantially identical dependence with that of borosilicate glass used for the substrate. The maximum phase difference direction was determined based on the measurement, and the specimen was rotated in this direction to measure the phase difference and the wavelength dispersion at Dnd. FIG. 13 shows the result of measurement. FIG. (a) shows the wavelength dispersion of the phase difference and FIG. (b) shows a calculation value for Dnd (nm)=wavelength (nm)×phase difference/360. Both FIGS. (a) and (b) show a difference spectrum obtained by subtracting the measured value or the calculated value only of the glass substrate. From the graphs, it can be seen that the phase difference and Dnd are substantially 0 and that the film scarcely shows the double refractivity.

A test for the close adhesion of the carbon film to the glass substrate was conducted. A specimen prepared by forming carbon film of a film thickness of about 280 nm, 600 nm and 2.2 μm respectively on a borosilicate glass wafer substrate of 10 cm diameter and 1 mm thickness and cutting out respective substrates each into about 20 mm square was used.

A flatwise test was conducted for the three specimens to evaluate the adhesion strength. A universal material tester Model 5565 manufactured by Instron Corporation was used for a measuring apparatus and a cross head moving amount method was used for a measuring method. A jig was bonded by an adhesive to each of the diamond film and the glass substrate of the specimens, an adhesion strength test (flatwise test) was conducted by a cross head moving amount method at a measuring temperature equal to room temperature (23° C.) to obtain a load-displacement diagram. A load upon initial fracture was read based on the obtained graph, and the adhesion strength was evaluated based on the value obtained by dividing the same with an adhesion area. The test was conducted at a speed of 0.5 mm/min. Further, data processing system "Merlin" manufactured by Instron Corporation was used for the data processing.

As the result of measurement, since peeling did not occur at the interface between glass and carbon film and peeling occurred at the interface between the adhesive and the jig in any of the specimens, the adhesion strength between glass and film could not be evaluated. However, it was found that the adhesion strength was at least 0.30 MPa or more.

Then, adhesion of the film to the glass substrate was evaluated by a scratch method using a Nano Indenter scratch option. In the adhesion evaluation by the scratch method, the surface of the specimen was scratched while applying a load on a diamond indenter (in other words, the specimen was scratched while indenting the diamond indenter therein) and it was evaluated by a vertical load when the film was peeled (critical peeling load).

As a measuring apparatus, Nano Indenter XP manufactured by MTS SYSTEMS CORPORATION was used, and Test Works 4 manufactured by MTS SYSTEMS CORPORATION was used as a computer software for measurement and analysis for the standard of the apparatus. XP (diamond Cube corner type) was used for the indenter (Tip). Measurement was conducted at a maximum indentation load of 20 to 250 mN, at a profile load of 20 μN, with a scratch distance of 500 μm, for the number of measuring points of 10, with an inter-measuring point distance of 50 μm, and at a measuring circumstance temperature of 23° C. (room temperature).

The maximum indentation load was determined by conducting an indentation test before the scratch test, and estimating a load to reach the substrate based on a load-displacement (indentation depth) curve.

The profile load is a load applied to an indenter upon scanning the specimen surface with a minute load (profile step) before the scratch test in order to detect the state of the specimen surface.

A specimen for measurement prepared by forming the diamond film according to the invention on a borosilicate glass wafer substrate of 10 cm diameter and 1 mm thickness, and cutting out the substrate into about 10 mm square was used. The specimen was set to a specimen table by using a crystal bond (hot melting adhesive) to conduct measurement.

The scratch test is conducted by the following three steps.
First step: Surface profiling with a minute load
The surface state is detected by the step.
Second step: Profile just before profile→scratch→profile just after
Scratch test is conducted while actually applying a load by the step.
Third step: Surface re-profile
The surface property for scratch flaws can be recognized by the step.

The steps are conducted on every measuring points, and the adhesion strength is evaluated as scratch hardness on every measuring points.

FIG. 14 shows an example of the result of the scratch test at a certain 1 measuring point for a carbon film of 600 nm thickness. In FIG. 14, the abscissa represents the scratch resistance and the ordinate represents the indentation depth. The maximum indentation load in this case was 20 mN. The graph shows three steps in the measurement. In the figure, the indentation depth increases abruptly between the scratch distance of 500 nm and the final point, and this is a typical example of the peeling phenomenon. The scratch hardness H of the specimen is determined based on the peeling starting point as described below.

$$H = P/A$$

in which P is a vertical load at the peeling position and A is an area of contact at the peeling start point. A is estimated as:

$$A = 2.5981 \times ht^2/3 \text{ (ht: indentation depth at the peeling start point).}$$

As described above, the scratch test was conducted on 10 measuring points of each specimen, an average was taken for meaningful measuring results, which was determined as a scratch hardness of the specimen. In a case of the specimen shown in FIG. 14, it was found that the scratch hardness reached 110 GPa and the adhesion was extremely high. Further, the standard deviation of the scratch hardness was about 6.2 with extremely less variation depending on the measuring points.

Further, for other specimens (film thickness about 280 nm) the carbon film did not peel even when the indenter reached the substrate, which showed such an intense adhesion as cannot be evaluated by the evaluation method.

For recognizing the electric characteristic of the carbon film according to the invention, electric resistance measurement and hole resistance measurement were conducted. Details for the measurements are to be described below. An electric resistance measuring apparatus and a hole effect measuring apparatus used were Resi Test Model 8310S equipment manufactured by Toyo Corporation. Further, a specimen holder used was model VHT manufactured by Toyo Corporation. The measured specimen was a carbon film of 500 nm thickness prepared on a Pyrex (registered trademark) glass substrate of 1 mm thickness by the method described above. Those cut out together with the glass substrate each into 4 mm square were measured. Ti was deposited to a circular shape of 0.3 mm diameter by vacuum vapor deposition to four corners of the specimen as an electrode. Further, Pt was vapor deposited to 50 nm and Au was vapor deposited to 100 nm thereon to prevent oxidation of the Ti electrode. The electrode was heat treated in an argon atmosphere at 400° C. intended for stabilization. This was attached to a specimen table made of high resistance alumina, and wiring was conducted by supersonic bonding of a gold wire having a φ of 250 μm to the electrode.

Measurement for the electric resistance was conducted in an atmosphere of helium at 1 mbar. Measurement was conducted each at 25° C. step from a room temperature up to 400° C.

FIG. 15 shows the temperature dependence of the electric resistivity of the specimen. At 100° C. or lower it had extremely high resistance, exceeding $1 \times 10^9$ Ωcm as the upper limit of the possible measuring range of the measuring equipment and no accurate measurement was possible. By extrapolation of measuring data at 100° C. or higher, it is considered that the electric resistivity at the room temperature is $1 \times 10^{10}$ Ωcm or higher. Further, also at 400° C., it showed a resistance value as high as $1 \times 10^3$ Ωcm or higher.

While it was tried to determine the electroconductivity type by the hole effect measurement, it could not be judged whether it was p-type or n-type due to the high resistance.

The electrical properties as described above show that the carbon film of the invention functions as an extremely excellent electric insulating film.

A carbon film was tried to be formed on a glass substrate at a substrate temperature of 100° C. or lower according to the invention. A surface wave plasma CVD treatment was conducted at a substrate temperature of about 95° C. for 7 hours. A borosilicate glass wafer of 10 cm diameter and 1 mm thickness was used for the substrate. A transparent film was formed on the substrate after the CVD treatment. The film was measured for the Raman scattering spectrum by the method described above. The result is shown in FIG. 16. From the graph, a peak showing diamond at Raman shift 1333 $cm^{-1}$ was distinctly observed and a full width at a half-maximum was about 25 $cm^{-1}$. Thus, it was found that a carbon film could be formed on the glass substrate by the method according to the invention even at a processing temperature of 100° C. or lower.

Carbon films were formed on glass substrates other than borosilicate glass and, further, on substrates other than glass such as of metals and plastics. Specifically, the following substrates were used.

Glass
  Soda lime glass: 150×150×t5 mm and 300×300×t3 mm
  Quartz: φ10×t2 mm and 50×26×t0.1 mm
Metal
  Copper: 20×20×t3 mm, 150 mm×150 mm×t2 mm and 300×300×t3 mm
  Iron: 20×20×t3 mm and 150 mm×150 mm×t2 mm
  Stainless steel (SUS 430): 20×20×t2 mm and 150 mm×150 mm×t2 mm
  Titanium: φ10×t2 mm
  Molybdenum: φ30×t5 mm
  Aluminum: 20×20×t2 mm and 150 mm×150 mm×t2 mm
  Super hard alloy: φ30×t5 mm
Plastic
  Polyether sulfon (PES): 20×20×t1 mm
Others
  Silicon (single crystal (001) face): φ100×t5 mm After the surface wave plasma CVD treatment, a diamond film was formed on each of the substrates. FIG. 17 shows Raman scattering spectra of the films formed on the substrates. The Raman scattering spectral measurement was conducted by the method described above. For each of the spectra, a peak was observed near the Raman shift at 1333 $cm^{-1}$.

For the diamond films on the copper substrate and the stainless steel substrate, the adhesion strength was evaluated by a scratch test. Measurement was identical with the evaluation for the scratch hardness by the scratch method using the Nano Indenter scratch option described above. The specimen used for the evaluation was a copper substrate of 20×20×t3 mm and a stainless steel (SUS 430) substrate of 20×20×t2 mm each formed with the diamond film, and the thickness of the diamond film was about 600 nm in each of them. The maximum indentation load in this case was 1 mN for the film on the copper substrate and 10 mN for the film on the stainless steel substrate. Other measuring conditions were quite identical with those for the method described above.

As a result of conducting the scratch test, the film did not cause peeling even when the indenter was indented by 1 μm which was larger than the film thickness and the evaluation for the adhesion strength was difficult. However, since it did not cause peeling even at the indentation depth larger than the film thickness, it can be considered that the adhesion is extremely excellent.

The hardness in the carbon film of the invention was measured by using a nano indenter. As a measuring apparatus, Nano Indenter XP manufactured by MTS SYSTEMS CORPORATION was used and measuring and analyzing computer software, Test Work 4 ver. 4.06A manufactured by MTS SYSTEMS CORPORATION. for the standard of the apparatus was used for the measurement and analysis. XP was used for the indenter (Tip).

A specimen for measurement prepared by forming the carbon film according to the invention on a single crystal (001) wafer substrate of 10 cm diameter and 1 mm thickness and cutting out the substrate to 10 mm square was used. In this case, the thickness of the carbon film was about 2.5 μm. The specimen was fixed to a specimen table by using a crystal bond (hot melting adhesive) to conduct measurement.

FIG. 18 shows the result of measurement for the hardness of the carbon film. The maximum indentation depth was 300 nm. Further, measurement was conducted at a room temperature (23° C.). As can be seem from the graph, it was found that the hardness of the carbon film reached as high as 100 GPa and it had a hardness substantially equal with that of usual diamond.

According to the method of the invention, a discontinuous carbon film comprising aggregates of carbon particles according to the invention was formed on the substrate. Upon depositing nano diamond particles, cluster diamond particles, graphite cluster diamond particles, adamantane, derivative thereof, or multimers thereof on the substrate before conducting the surface wave plasma CVD treatment according to the method of the invention, the deposition density of them to the substrate can be decreased by extremely lowering the concentration of them to a dispersion medium or a solvent for dispersing or dissolving them. This can lower the surface density for the generation of nuclei of diamond upon CVD treatment and can form not a continuous film but a discontinuous film on the substrate. In this case, the grain size of the carbon particles constituting the discontinuous film can be controlled depending on the time for the surface wave plasma CVD treatment (the size is smaller as the time is shorter and the size is larger as the time is longer).

FIG. 19 shows an optical microscopic photograph for the discontinuous carbon film thus formed in this way on the borosilicate glass substrate. An optical microscope, LEITZDMR manufactured by Leica Co. was used for observation. For taking the photograph, digital camera DFC 280 manufactured by Leica Co. as the standard of the microscope and 1M50 ver. 4.0 Release 117 as the photographing and analyzing compute software were used. Further, in this case, a borosilicate glass wafer substrate of 10 cm diameter and 1 mm thickness was dipped in a liquid dispersion in which graphite cluster diamond particles were dispersed extremely thinly in ethanol (concentration: about 0.01 wt %) before the film deposition treatment, and pre-treatment was conducted by supersonic treatment. Subsequently, a surface plasma CVD treatment was conducted for about 7 hours. The average grain size of the diamond particles shown in FIG. 19 was about 3 μm. In this case it is considered that a single particle is an aggregate of carbon particles (crystallites) by the number of 200 in average. The surface density of particles in this case was about $5 \times 10^6$ $cm^{-2}$, which was considered to be substantially equal with the deposition density of the graphite cluster diamond particles deposited to the substrate by the pre-treatment.

The discontinuous film comprising the carbon particle aggregates shown in FIG. 19 contains a number of isolated carbon particles on the glass substrate and carbon particle powder can be obtained in a case of the discontinuous carbon particle powder by removing the substrate by hydrofluoric acid treatment or the like.

As shown in FIG. 20, the carbon film of the invention was laminated on a quartz glass plate and the operation thereof as a grinding tool was confirmed. The tested quartz glass had 30 mm φ and 1 mm thickness and a carbon film of the invention was deposited to a thickness of 500 nm on the surface to form a laminate. The surface of the quartz glass was polished before deposition of the carbon film and it was confirmed by the observation under an atomic force microscope (AFM) that it had a planarity of about 1 mm as surface roughness Ra. A titanium plate was rubbed frictionally for 100 cycles reciprocally to the laminate and the change of Ra before and after thereof was measured by AFM. While Ra of the titanium plate before rubbing was 100 nm, Ra after rubbing was 20 nm to confirm the improvement of the planarity. It was confirmed that the laminate using the carbon film of the invention functions as a grinding tool.

The carbon film of the invention was laminated on glass and the optical confinement effect was demonstrated. The carbon film of the invention was deposited to a thickness of 200 nm on the surface of usual slide glass (25 mm×75 mm, about 1 mm thickness) to form a laminate. FIG. 21 shows a structure of an optical device. When a light was entered from a mercury lamp at an angle of about 45° from one end to the surface of the carbon film of the laminate, light was emitted from the other end apart by 40 mm. Thus, it could be confirmed that the light from the mercury lamp incident from one end of the carbon film repeats total reflection at the boundary surface between the carbon film and the slide glass and at the boundary surface between the carbon film and air, and is propagated while being confined as far as the other end. As described above, it was found that the carbon film of the invention can be utilized as an optical device such as an optical waveguide channel by utilizing the high refraction index.

The carbon film of the invention was coated on glass to demonstrate the flaw preventive effect. The carbon film of the invention was coated to 300 nm thickness on the surface of borosilicate glass of 10 cm diameter and 1 mm thickness. Then, it was rubbed by #1000 sand paper for 100 cycles reciprocally. The result is shown in FIG. 22(a). Further, FIG. 22(b) is a photograph showing the result of conducting an identical test for borosilicate glass not coated with the carbon film of the invention. As shown, glass coated with the carbon film of the invention was scarcely injured. On the other hand, glass not coated with the carbon film of the invention was injured. As described above was found that the carbon film of the invention shows high flaw preventive effect for optical glass. Accordingly, coating of the carbon film of the invention enables application use, for example, to optical glass, lenses, and spectacles with improved flaw-preventive effect.

A carbon film of the invention was deposited to 300 mm thickness on quartz glass and a wrist watch having the same for wind proofness was formed as shown in FIG. 23, to demonstrate the function as flaw prevention for a wind proof body. The surface of the wind proof member was rubbed with #1000 sand paper for 100 cycles reciprocally, it was not injured at all. As described above, it was confirmed that a wrist watch having a laminate of the carbon film and the quartz glass of the invention as a wind proof has a characteristic that the wind proof surface is less injured.

A carbon film of the invention of 500 nm thickness was deposited on a thin aluminum plate of 0.3 mm thickness to form a laminate and, further, an electronic circuit pattern was formed with copper on the carbon film to prepare an electronic circuit substrate. FIG. 24 is a schematic view for the electronic circuit substrate. It was confirmed that the electric insulating property of copper and aluminum putting the carbon film therebetween was extremely excellent. The substrate may not only be aluminum but other materials. It has been confirmed that the laminate using the carbon film of the invention functions as an electronic circuit substrate.

Figure 1:
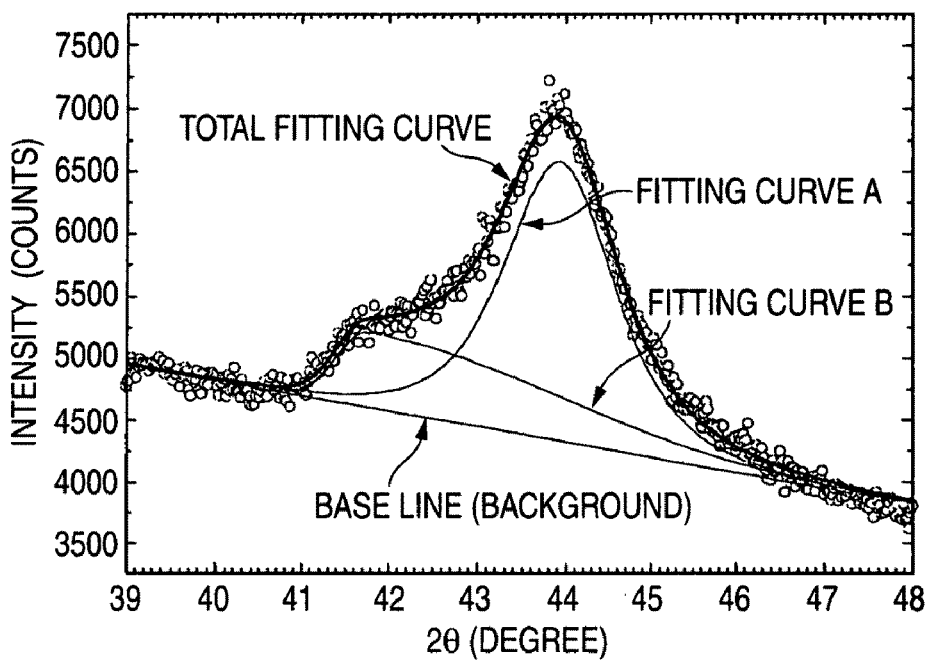
FIG. 1 shows an X-ray diffraction spectrum of a carbon film as an example of the invention by $CuKa_1$ X rays, and the result of peak fitting. In the drawing, blank circles show measured values.
Figure 2:
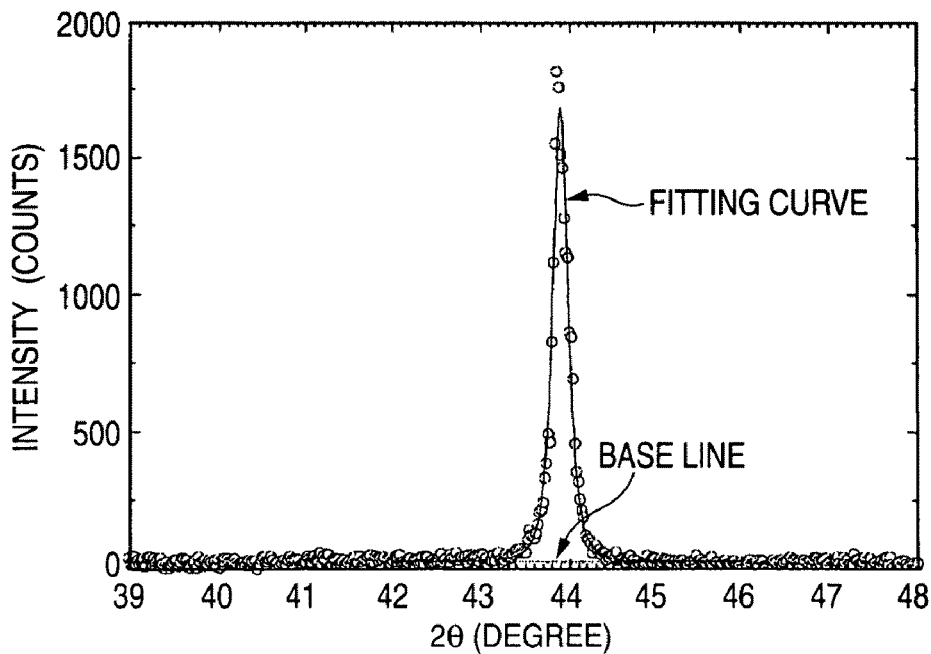
FIG. 2 shows a typical X-ray diffraction spectrum of diamond by $CuKa_1$ X-rays ((111) reflection peak), and a result of peak fitting. In the drawing blank circles show measured values.
Figure 3:
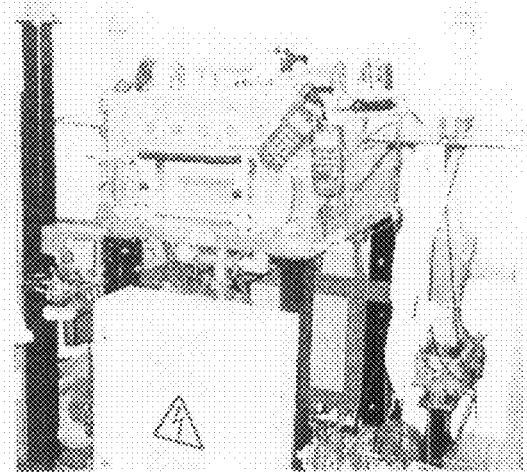
FIG. 3 is an appearance of a microwave plasma CVD apparatus for large area deposition used in the invention.
Figure 4A:
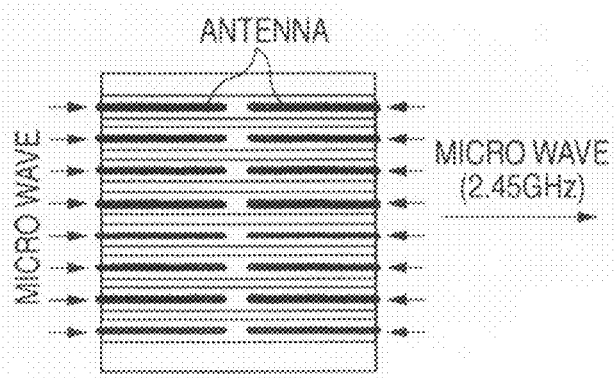
FIG. 4 shows the constitution of a reaction vessel of a microwave plasma CVD apparatus of a microwave plasma CVD apparatus for large area deposition used in the invention.
Figure 4B:
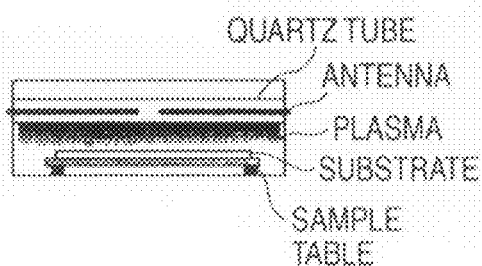
Figure 5:
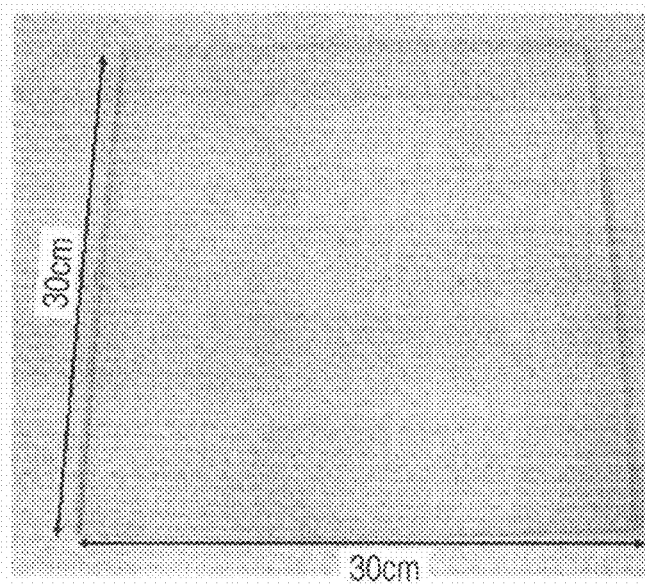
FIG. 5 is a photograph of a carbon film formed on a glass substrate (300 mm×300 mm) according to the invention.
Figure 6:
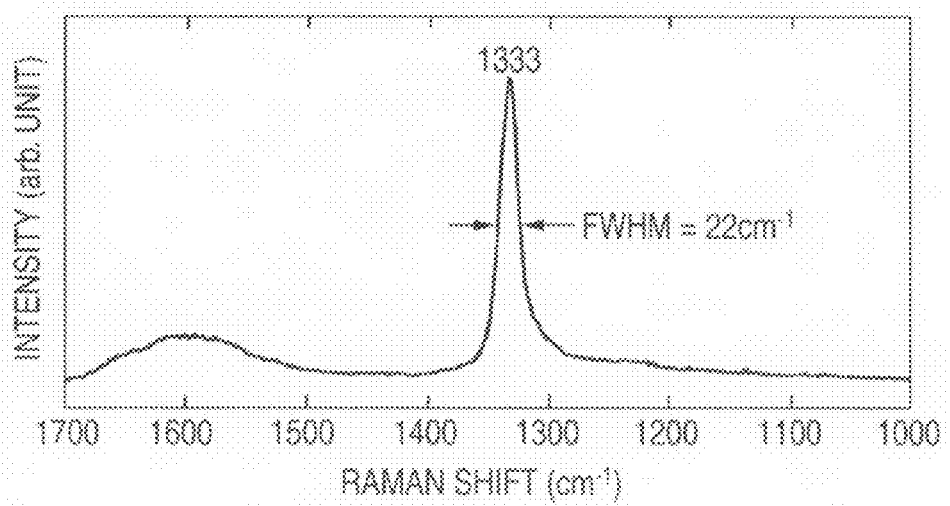
FIG. 6 is a Raman scattering spectral spectrum chart of a carbon film as an example of the invention.
Figure 7A:
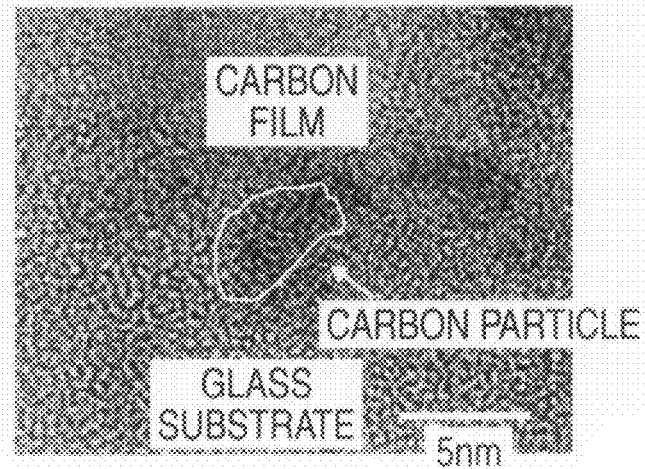
FIG. 7 is a photograph of a high resolution transmission type electron microscope (HRTEM) for the cross section of a carbon film on a glass substrate according to the invention. FIG. (a) shows a boundary surface between a glass substrate and a carbon film, FIG. (b) shows the outermost surface of the carbon film, FIG. (c) shows electron beam refraction images of the carbon film and FIG. (d) is an electron energy loss spectral (EELS) spectrum view (C-K shell absorption edge).
Figure 7B:
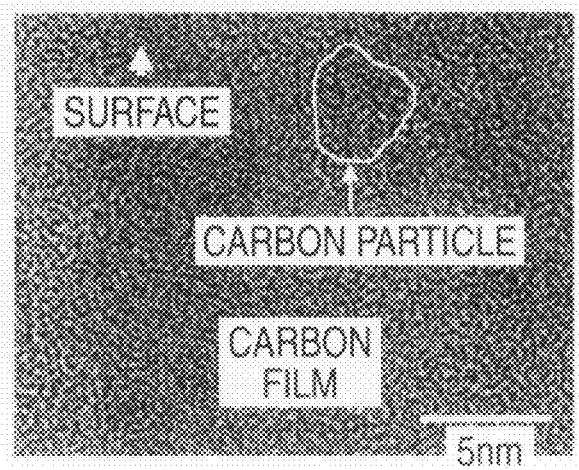
Figure 7C:
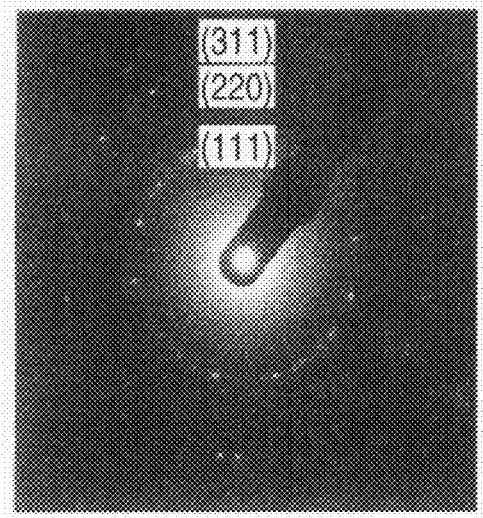
Figure 7D:
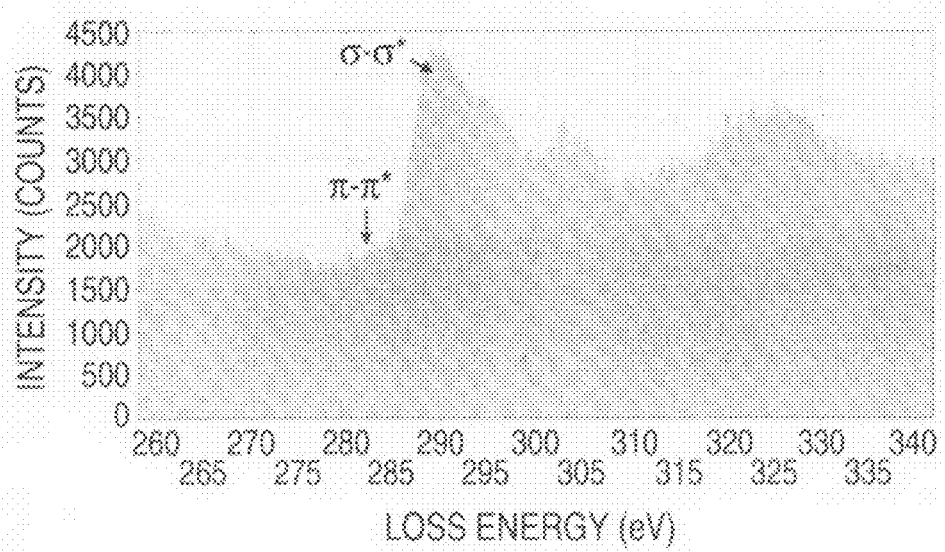
Figure 8:
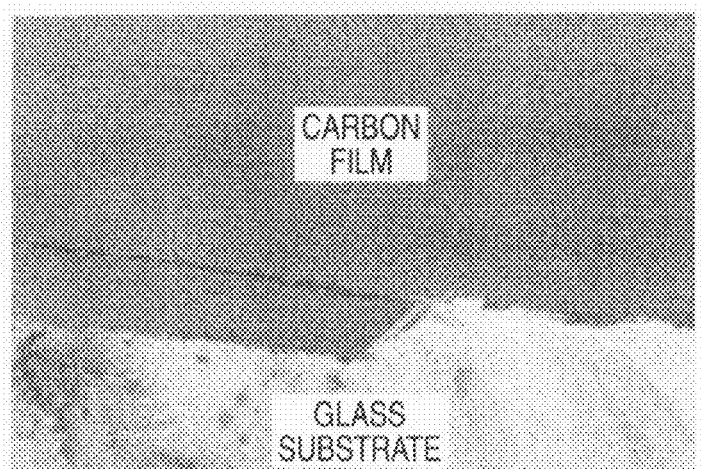
FIG. 8 is a scanning type electron microscopic photograph for the cross section of a carbon film as an example formed on a glass substrate according to the invention.
Figure 9:
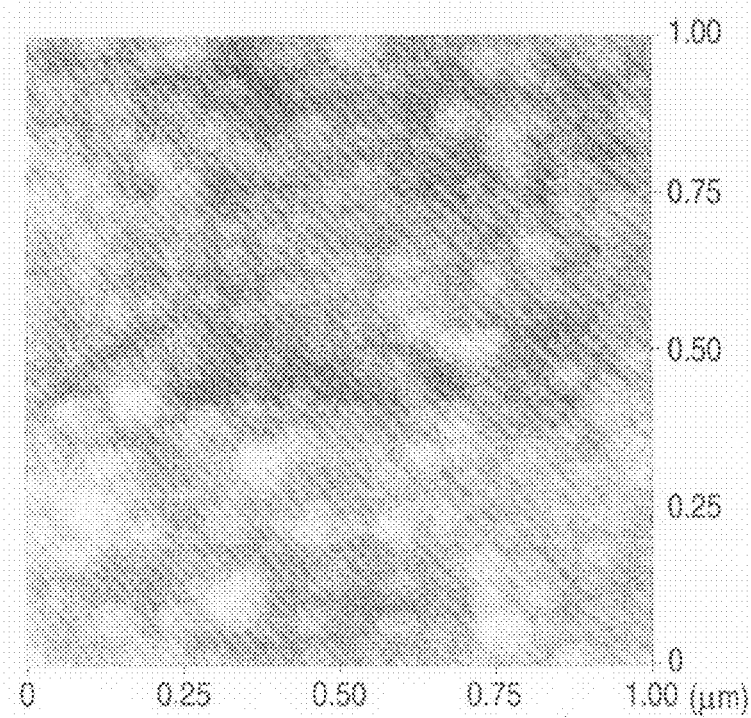
FIG. 9 is an atomic force microscope (AFM) photograph for the surface of a carbon film (1.6 μm thickness) formed on a quartz substrate (Ra=0.87 nm) according to the invention.
Figure 10:
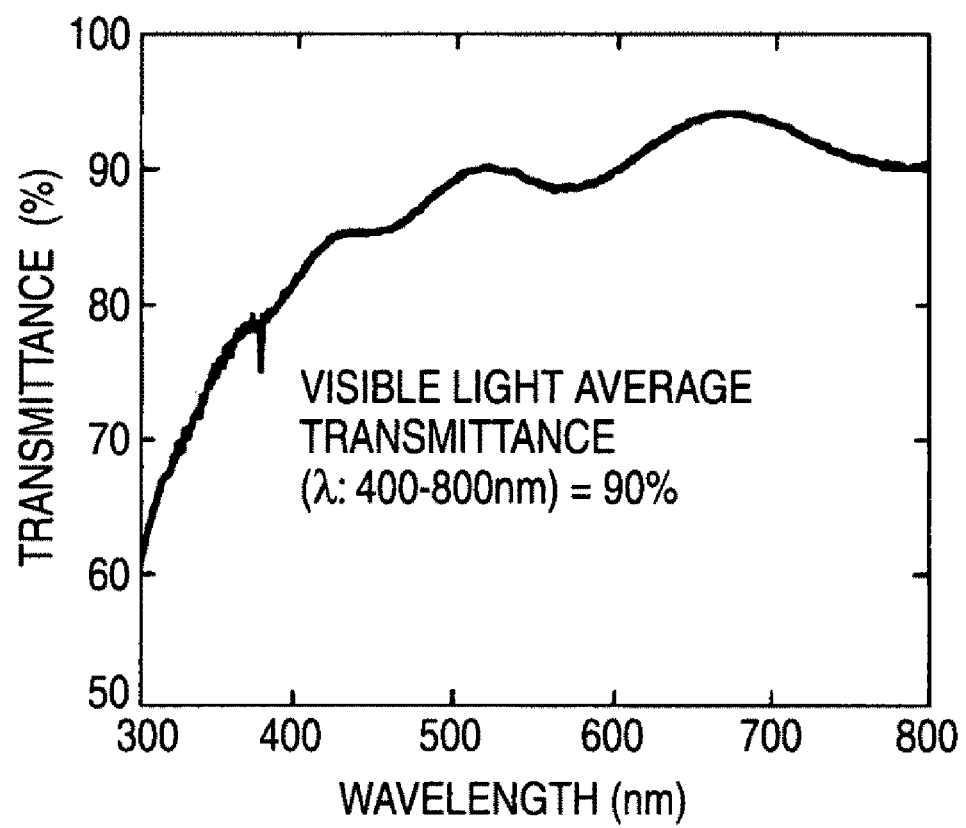
FIG. 10 is a wavelength dispersion graph of a transmittance in a visible light region of a carbon film (about 500 nm thickness) of an example formed on a glass substrate according to the invention.
Figure 11:
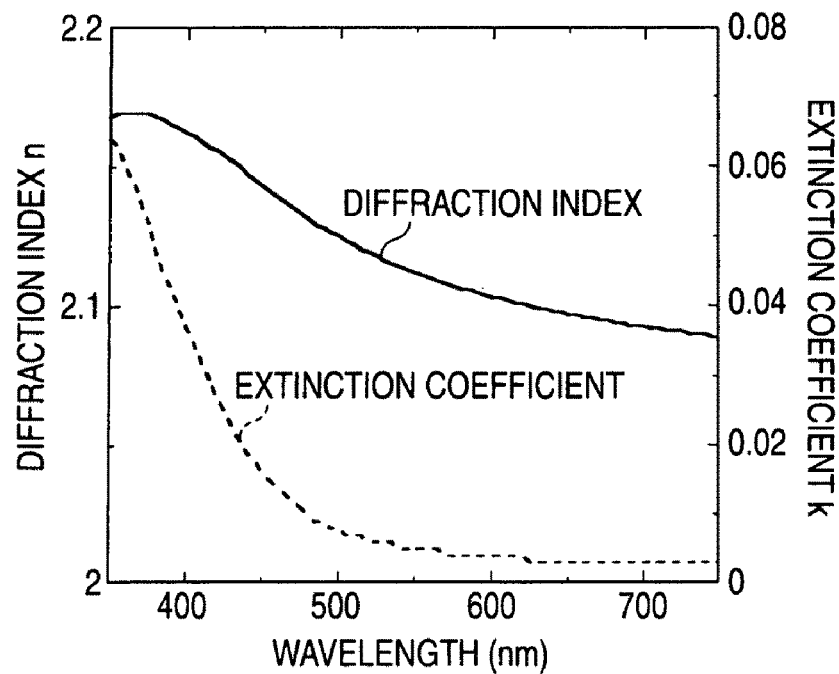
FIG. 11 is a wavelength dispersion graph of a refraction index and an extinction coefficient of a carbon film of an example formed on a glass substrate according to the invention.
Figure 12:
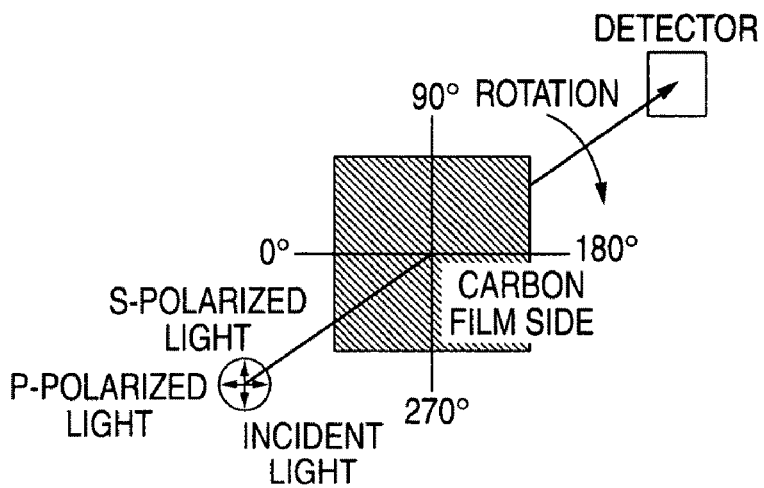
FIG. 12 is a schematic view showing a double refraction measuring method for a carbon film of an example formed on a glass substrate according to the invention.
Figure 13:
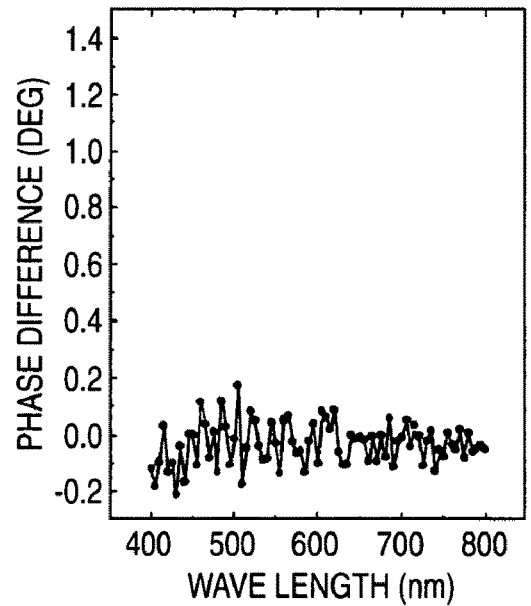
FIG. 13 is a wavelength dispersion graph of phase difference and of a carbon film (about 200 nm thickness) of an example formed on a glass substrate according to the invention. In the data in the graph, measured values only for the glass substrate are subtracted from measured values for the glass substrate formed with the carbon film.
Figure 13:
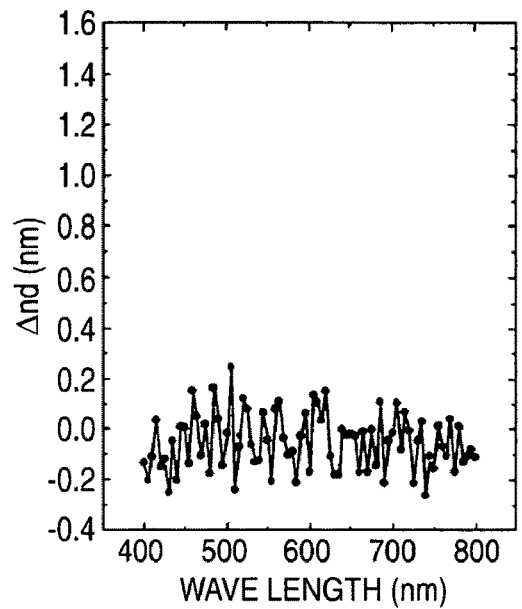
Figure 14:
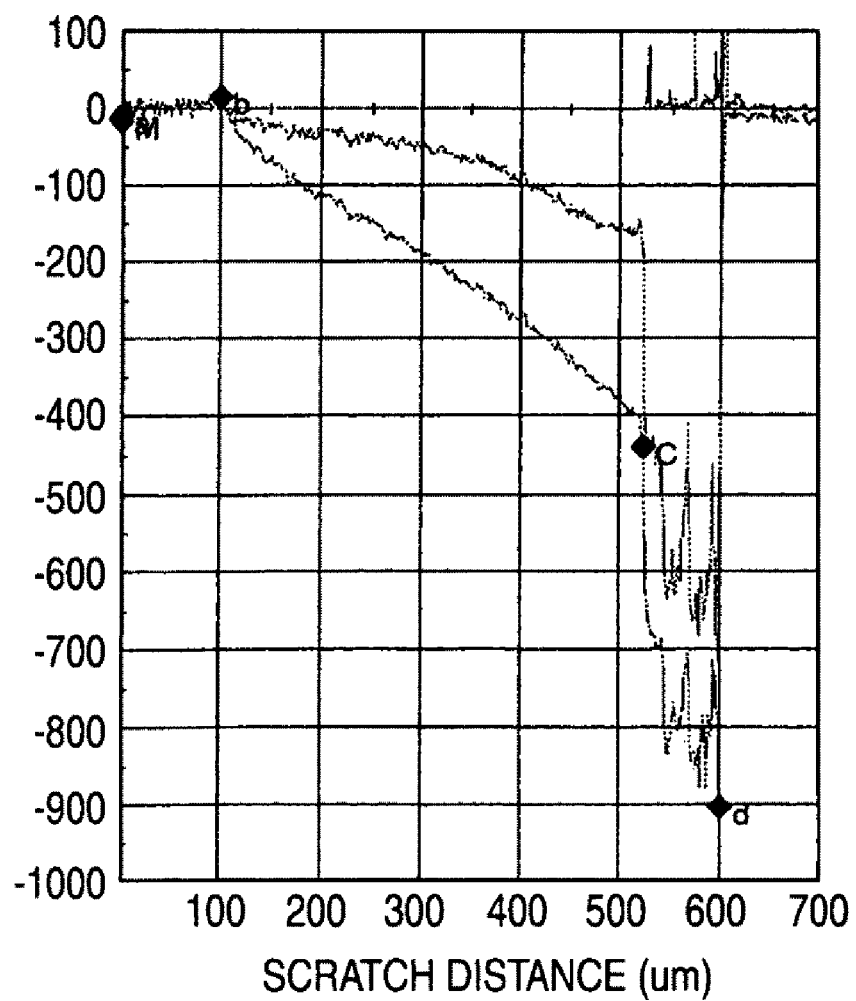
FIG. 14 shows an example of the result of measurement at a certain measuring point in a scratch test of a carbon film (about 600 nm thickness) as an example formed on a glass substrate in the invention. The abscissa represents the scratch distance and the ordinate represents the indentation depth in the graph.
Figure 15:
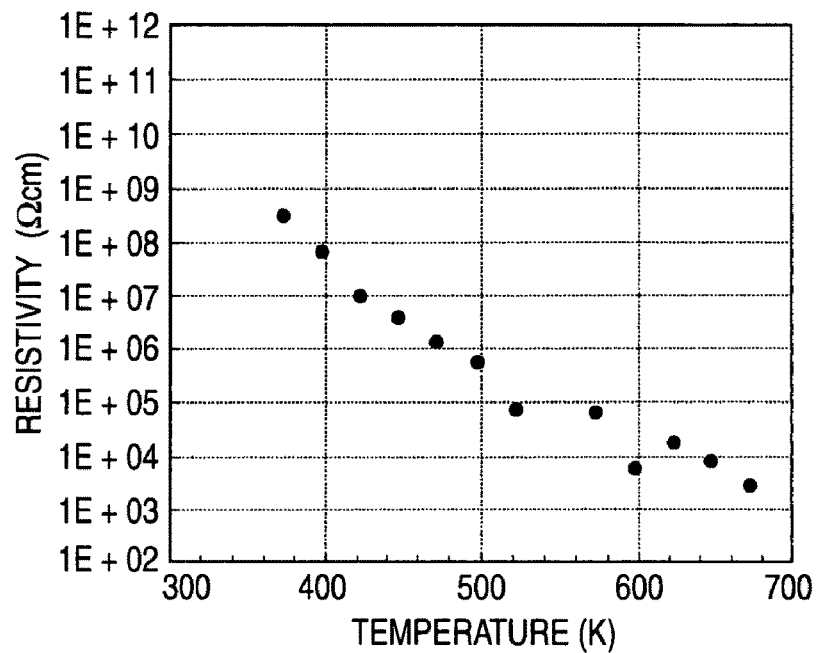
FIG. 15 is a graph showing the dependence of the electric resistivity on the temperature of one example of the carbon film (about 500 nm thickness) formed on the glass substrate according to the invention.
Figure 16:
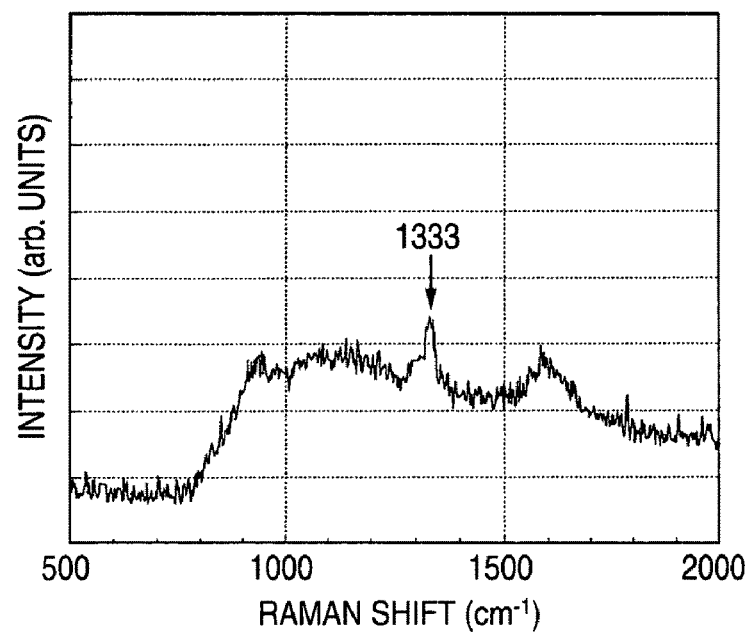
FIG. 16 is a Raman scattering spectrum chart of one example of a carbon film formed on a glass substrate at a low substrate temperature of 100° C. or lower (about 95° C.) according to the invention).
Figure 17:
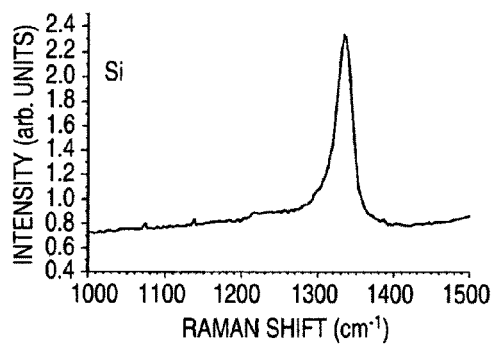
FIG. 17 shows Raman scattering spectral charts of one examples of a carbon film formed on various kinds of substrates according to the invention. Substrate are (a) Si, (b) quartz glass, (c) Ti, (d) WC, (e) Cu, (f) Fe, (g) soda lime glass, (h) stainless steel (SUS 430), and (i) Al, respectively.
Figure 17:
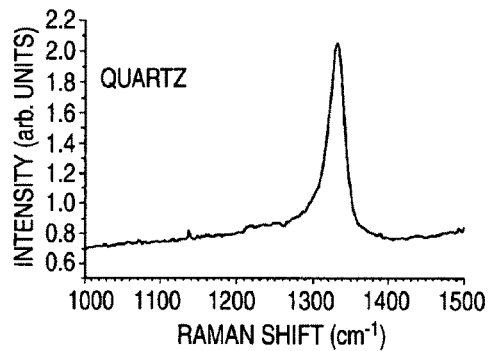
Figure 17:
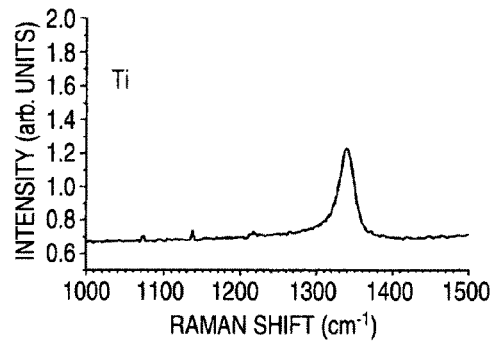
Figure 17:
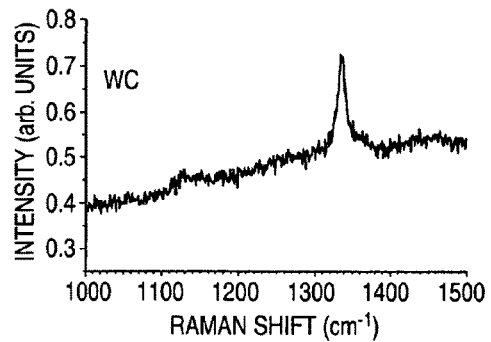
Figure 17:
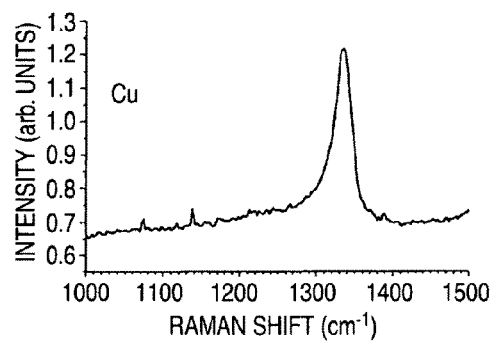
Figure 17:
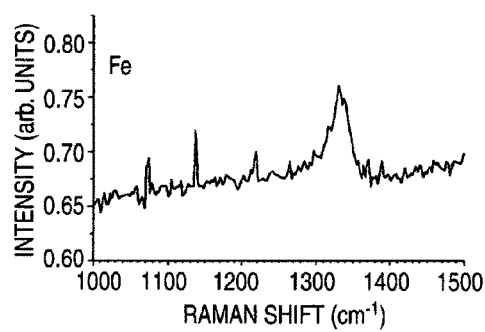
Figure 17:
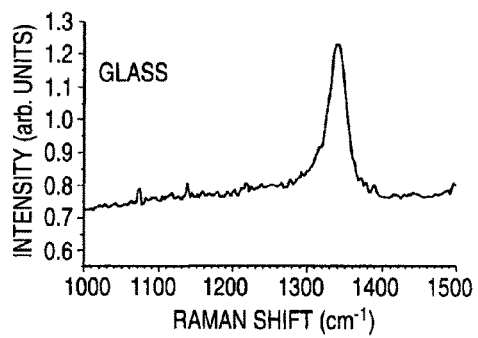
Figure 17:
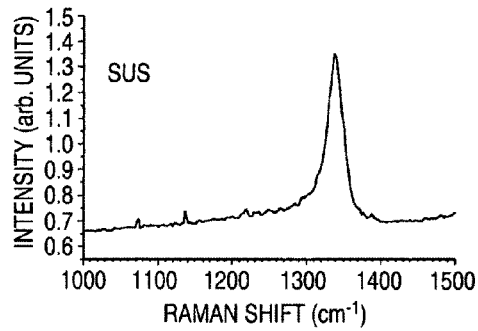
Figure 17:
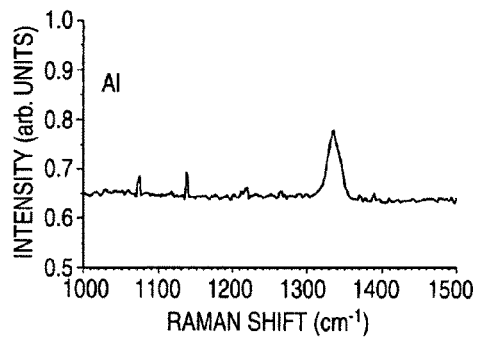
Figure 18:
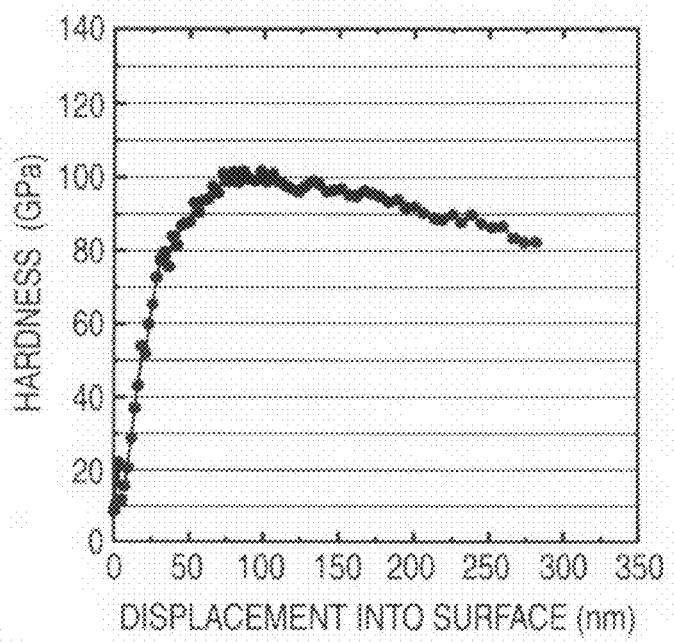
FIG. 18 is a graph showing the result of measurement for hardness by a Nano Indenter of one example of a carbon film formed on a silicon substrate according to the invention.
Figure 19:
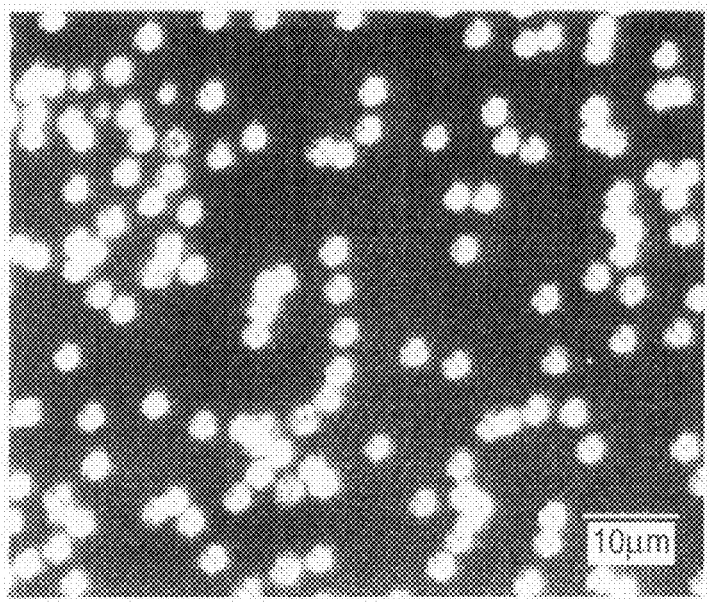
FIG. 19 is an optical microscopic photograph of one example of discontinuous carbon film particles formed on a glass substrate according to the invention.
Figure 20:
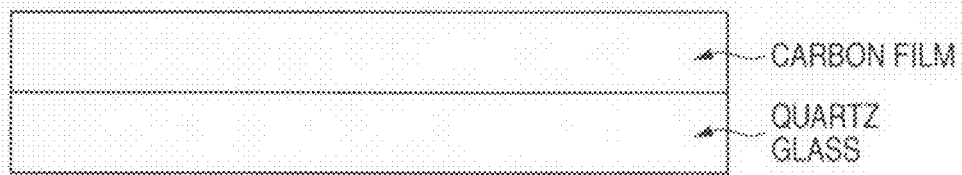
FIG. 20 shows a polishing tool including a carbon film of the invention and quartz glass.
Figure 21:
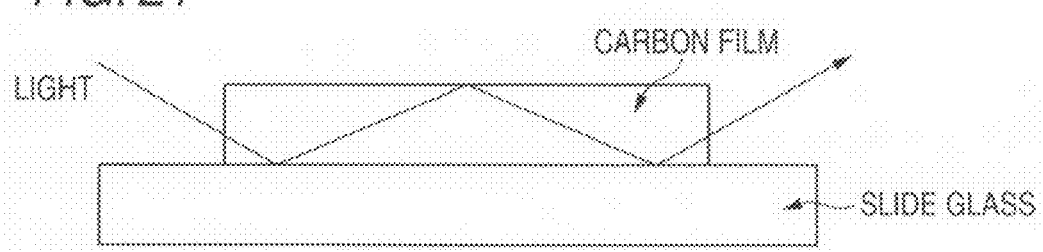
FIG. 21 shows an optical device including a carbon film of the invention and glass.
Figure 22:
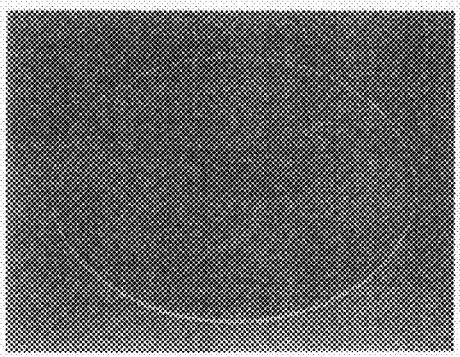
FIG. 22 is a photograph showing the glass protective film effect of the carbon film of the invention. FIG. (a) shows borosilicate glass coated with a carbon film of the invention and FIG. (b) shows borosilicate glass without coating. Both FIGS. (a) and (b) show photographs for the trace after rubbing with sand paper (#1000) for 100 cycles reciprocally.
Figure 22:
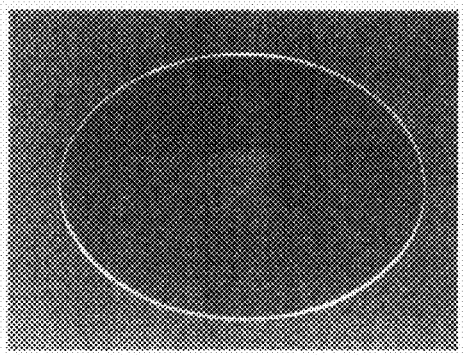
Figure 23:
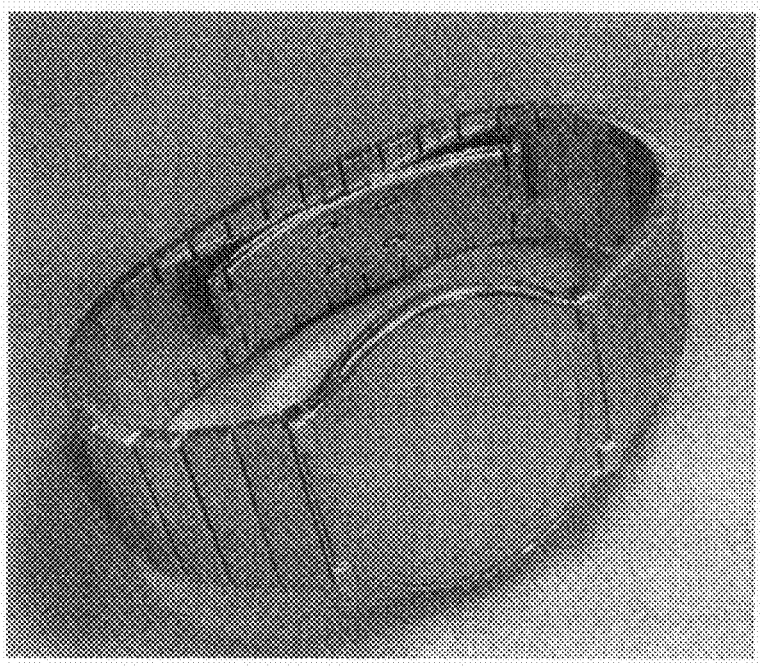
FIG. 23 shows a wrist watch having a laminate including a carbon film of the invention and quartz glass as a wind shield.
Figure 24:
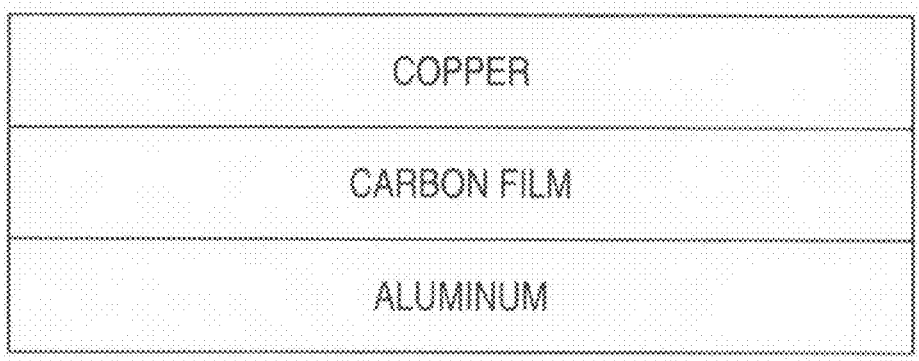
FIG. 24 is a schematic view of an electronic circuit substrate obtained by forming an electronic pattern with copper on a laminate including an aluminum plate and a carbon film according to the invention.

The invention claimed is:

1. A carbon film, which has an approximate spectrum curve obtainable by superimposing, on a peak fitting curve A at a Bragg's angle (2θ±0.3°) of 43.9°, a peak fitting curve B at 41.7° and a base line in an X-ray diffraction spectrum by CuKa$_1$ ray,
said fitting curve B having an intensity of from 5 to 90% relative to an intensity of the fitting curve A, said carbon film having a film thickness of from 2 nm to 100 μm,
said carbon film having a Raman shift having a peak at 1333 cm$^{-1}$±10 cm$^{-1}$,
said peak having a half-value width of from 10 to 40 cm$^{-1}$ in the Raman scattering spectrum,
wherein the fitting curve A is a curve of a Pearson VII function, the fitting curve B is a curve of an asymmetric normal distribution function, and the base line is represented by a primary function,
wherein said carbon film comprises a structure in which a cubic diamond and a hexagonal diamond are mixed and a defect remains at a high concentration in a portion removed by etching, and a peak is observed at 2θ of 43.9°±0.3° in the X-ray diffraction spectrum in the cubic diamond and a peak is observed at 2θ of 41.7°±0.3° in the X-ray diffraction spectrum in the defect,
wherein the crystal defect comprises hexagonal diamond and a point defect including atomic vacancy, a linear defect including relocation or a defect on the basis of a surface unit including a lamination defect, and
wherein the defect is formed in a portion formed by removing a graphite or amorphous carbonaceous substance deposited in the course of the film formation by etching.

2. The carbon film according to claim 1, which has a Raman shift having a peak at around 1580 cm$^{-1}$ in the Raman scattering spectrum based on sp$^2$ bond component of carbon derived from a component including a graphite or amorphous carbonaceous substance.

3. The carbon file according to claim 1 wherein a surface density of the carbon is 8×10$^{10}$ cm$^{-2}$ to 4×10$^{12}$ cm$^{-2}$.

4. A laminate comprising: a substrate; and a carbon aggregate film having a thickness of 2 nm to 100 μm which is disposed on the substrate, said carbon aggregate film comprising an aggregate of carbon particles having an approximate spectrum curve obtainable by superimposing, on a peak fitting curve A at a Bragg's angle (2θ±0.3°) of 43.9°, a peak fitting curve B at 41.7° and a base line in an X-ray diffraction spectrum by CuKa$_1$ ray,
said fitting curve B having an intensity of from 5 to 90% relative to an intensity of the fitting curve A, said carbon particles having a Raman shift having a peak at 1333±10 cm$^{-1}$,
said peak having a half-value width of from 10 to 40 cm$^{-1}$ in the Raman scattering spectrum, said carbon particles being aggregated on the substrate to give a surface density of from 1×10$^{10}$ cm$^{-2}$ to 4×10$^{13}$ cm$^{-2}$,
wherein the fitting curve A is a curve of a Pearson VII function, the fitting curve B is a curve of an asymmetric normal distribution curve, and the base line is represented by a primary function,
wherein said carbon film comprises a structure in which a cubic diamond and a hexagonal diamond are mixed and a defect remains at a high concentration in a portion removed by etching, and a peak is observed at 2θ of 43.9°±0.3° in the X-ray diffraction spectrum in the cubic diamond and a peak is observed at 2θ of 41.7°±0.3° in the X-ray diffraction spectrum in the defect,
wherein the crystal defect comprises hexagonal diamond and a point defect including atomic vacancy, a linear defect including relocation or a defect on the basis of a surface unit including a lamination defect, and
wherein the defect is formed in a portion formed by removing a graphite or amorphous carbonaceous substance deposited in the course of the film formation by etching.

5. The laminate according to claim 4, wherein the substrate is a member selected from the group consisting of glass, quartz, silicon, plastic, ceramic, a metal and a metal alloy.

6. The laminate according to claim 5, wherein the substrate is glass, and which has an adhesion between the glass substrate and the carbon aggregate film of 20 GPa or more.

7. The laminate according to claim 5, wherein the substrate is stainless steel, and wherein the stainless steel substrate and the carbon aggregate film have an adhesion strength of 0.3 MPa in a flatwise test.

8. The laminate according to claim 5, wherein the substrate is copper, and wherein the copper substrate and the carbon aggregate film have an adhesion strength of 0.3 MPa in a flatwise test.

9. The laminate according to claim 4 wherein a surface density of the carbon is 8×10$^{10}$ cm$^{-2}$ to 4×10$^{12}$ cm$^{-2}$.

* * * * *